(12) United States Patent
Wada

(10) Patent No.: US 8,653,205 B2
(45) Date of Patent: Feb. 18, 2014

(54) RESIN COMPOSITION FOR ENCAPSULATING SEMICONDUCTOR AND SEMICONDUCTOR DEVICE

(75) Inventor: Masahiro Wada, Tokyo (JP)

(73) Assignee: Sumitomo Bakelite Co., Ltd., Tokyo (JP)

( * ) Notice: Subject to any disclaimer, the term of this patent is extended or adjusted under 35 U.S.C. 154(b) by 166 days.

(21) Appl. No.: 13/255,571

(22) PCT Filed: Mar. 2, 2010

(86) PCT No.: PCT/JP2010/001410
§ 371 (c)(1),
(2), (4) Date: Sep. 9, 2011

(87) PCT Pub. No.: WO2010/103745
PCT Pub. Date: Sep. 16, 2010

(65) Prior Publication Data
US 2012/0001350 A1    Jan. 5, 2012

(30) Foreign Application Priority Data

Mar. 11, 2009 (JP) .............................. P2009-057387

(51) Int. Cl.
*C08K 3/36* (2006.01)
*C08L 63/00* (2006.01)
*C08L 63/02* (2006.01)
*H01L 23/29* (2006.01)

(52) U.S. Cl.
USPC ............ 525/481; 257/793; 523/457; 523/466

(58) Field of Classification Search
None
See application file for complete search history.

(56) References Cited

U.S. PATENT DOCUMENTS

| | | | |
|---|---|---|---|
| 5,319,005 A * | 6/1994 | Hagiwara et al. ............. | 523/435 |
| 7,675,185 B2 * | 3/2010 | Tendou et al. ................ | 257/789 |
| 8,409,704 B2 * | 4/2013 | Fukuhara et al. ....... | 428/355 EP |
| 2009/0096114 A1 * | 4/2009 | Kotani et al. ................ | 257/793 |

FOREIGN PATENT DOCUMENTS

| JP | 4-68019 A | * | 3/1992 |
|---|---|---|---|
| JP | 6-100665 A | * | 4/1994 |
| JP | 6-239967 A | | 8/1994 |
| JP | 6-239967 A | * | 8/1994 |
| JP | 8-52734 A | | 2/1996 |
| JP | 2551548 B2 | | 11/1996 |
| JP | 10-175210 A | | 6/1998 |
| JP | 2000-191886 A | * | 7/2000 |
| JP | 2000-191886 A | | 7/2000 |
| JP | 2000-212390 A | | 8/2000 |
| JP | 2000-212390 A | * | 8/2000 |
| JP | 2001-316453 A | * | 11/2001 |
| JP | 2002-3578 A | | 1/2002 |
| JP | 2002-37863 A | * | 2/2002 |
| JP | 2002-37863 A | | 2/2002 |
| JP | 2008-81562 A | * | 4/2008 |

OTHER PUBLICATIONS

International Search Report, dated Jun. 8, 2010 in PCT/JP2010/001410.

* cited by examiner

*Primary Examiner* — Robert Sellers
(74) *Attorney, Agent, or Firm* — Birch, Stewart, Kolasch & Birch, LLP

(57) ABSTRACT

Disclosed is a resin composition for encapsulating a semiconductor containing an epoxy resin (A), a curing agent (B), and an inorganic filler (C), wherein the epoxy resin (A) includes an epoxy resin (A1) having a predetermined structure, and the curing agent (B) includes a phenol resin (B1) having a predetermined structure, wherein the content of a c=1 component included in the total amount of the phenol resin (B1) is not less than 40% in terms of area percentage and the content of a C≥4 component is not more than 20% in terms of area percentage, as measured by the area method of gel permeation chromatography. Also disclosed is a semiconductor device obtained by encapsulating a semiconductor element with a cured product of the resin composition for encapsulating a semiconductor.

6 Claims, 6 Drawing Sheets

RESIN COMPOSITION FOR ENCAPSULATING SEMICONDUCTOR AND SEMICONDUCTOR DEVICE

TECHNICAL FIELD

The present invention relates to a resin composition for encapsulating a semiconductor and a semiconductor device.

BACKGROUND ART

As a method to encapsulate a semiconductor device with a resin, there are transfer molding, compression molding, injection molding and the like. In the transfer molding which is more generally used, a resin composition for encapsulating a semiconductor in a tablet shape is usually supplied to a molding machine. The tablet-like resin composition for encapsulating a semiconductor can be obtained by melt-kneading an epoxy resin, a curing agent, a curing accelerator, an inorganic filler or the like using a roll, an extruder or the like, followed by cooling and pulverizing, and press-molding into a columnar or rectangular tablet (tableting). In a mass production process of the resin composition for encapsulating a semiconductor, it is continuously tableted using a unitary or rotary tablet press. At this time, however, there are failures such as breaking or cracking of tablets, or poor appearance caused by attachment of a resin composition to the inner surface of a mold in a tablet press which leads to roughness over the tablet surface, in some cases. The broken or cracked tablets cause a conveyance failure or a filling failure during a package molding process, and poor appearance causes breaking or cracking of tablets during conveyance in some cases. As a method to reduce breaking, cracking and poor appearance described above, there have been proposed, for example, a method of optimizing surface roughness of a mold in a tablet press, a method of controlling an environmental temperature or a mold temperature, and the like (for example, see Patent Documents 1, 2 and 3).

On the other hand, in the recent market trend of miniaturization, lightweightness, and high performance of electronic devices, the degree of integration of semiconductor elements has been increasing year by year, and a method for mounting semiconductor elements has been changing from an insertion mounting to a surface mounting. As the shape of the semiconductor package, there has appeared a package capable of coping with small size, light weight and high pin counts typically exemplified by a surface mounting type quad flat package (QFP), and there have further appeared a package with higher pin counts and narrower pitches of the wiring, and a package having a structure obtained by laminating chips inside one package. In such a semiconductor device, since the thickness of a resin-encapsulated portion is thin and the wire density is increased, molding failures during a package molding process, such as incomplete filling, formation of voids, wire sweep and the like, tend to easily occur, as compared to a conventional semiconductor device. Then, for the purpose of improvement of flow characteristics, there have generally been used low molecular weight or crystalline epoxy resin and curing agent for an epoxy resin and a curing agent.

However, when low molecular weight or crystalline epoxy resin and curing agent are combined, the flowability of a resin composition is improved and the molding yield rate is improved. However, breaking, cracking or poor appearance easily occurs during a tablet molding process, the tablet moldability is not fully improved in the aforementioned tableting process, and both package moldability and tablet moldability are not achieved in some cases.

RELATED DOCUMENT

Patent Document

Patent Document 1: Japanese Patent No. 2551548

Patent Document 2: Japanese Laid-Open Patent Publication No. 1996-52734

Patent Document 3: Japanese Laid-Open Patent Publication No. 1998-175210

DISCLOSURE OF THE INVENTION

An object of the present invention is to provide a resin composition for encapsulating a semiconductor excellent in the flowability and moldability during the molding of a package without damaging the tablet yield rate, and a semiconductor device using the resin composition.

The resin composition for encapsulating a semiconductor of the present invention is a resin composition for encapsulating a semiconductor containing an epoxy resin (A), a curing agent (B) and an inorganic filler (C), wherein the epoxy resin (A) contains an epoxy resin (A1) having a structure represented by the following general formula (1), the curing agent (B) contains a phenol resin (B1) represented by the following general formula (2), the content of a c=1 component contained in the total amount of the phenol resin (B1) represented by the general formula (2) is not less than 40% in terms of area percentage, and the content of a C≥4 component is not more than 20% in terms of area percentage, as measured by the area method of gel permeation chromatography,

[Chemical Formula 1]

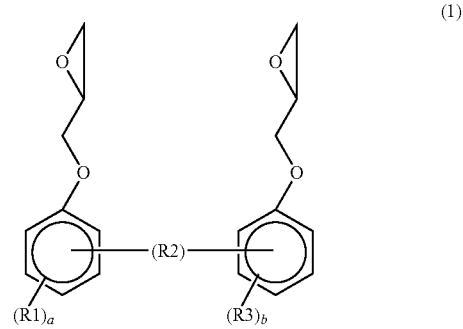

(1)

wherein, in the above general formula (1), each of R1 and R3 is a hydrocarbon group having 1 to 5 carbon atoms, which may be the same or different from each other; R2 represents any of a direct bond, a hydrocarbon group having 1 to 5 carbon atoms, —S— and —O—; and each of a and b is an integer of 0 to 4, which may be the same or different from each other,

[Chemical Formula 2]

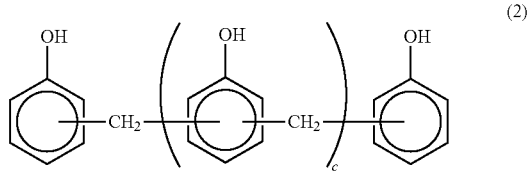

wherein, in the above general formula (2), c is an integer of 0 to 20.

In the phenol resin (B1) contained in the resin composition for encapsulating a semiconductor of the present invention, the content of a c=0 component contained in the total amount of the phenol resin (B1) represented by the above general formula (2) is not more than 16% in terms of area percentage, as measured by the area method of gel permeation chromatography.

In the resin composition for encapsulating a semiconductor of the present invention, the epoxy resin (A1) is a crystalline epoxy resin obtained by subjecting a phenol compound selected from the group consisting of alkyl group-substituted or unsubstituted biphenol, bisphenol A, bisphenol F, bisphenol S, bisphenol A/D and oxybisphenol to diglycidyl etherification.

In the resin composition for encapsulating a semiconductor of the present invention, the epoxy resin (A1) has a melting point, and on condition that its melting point is $T_{A1}$ and the softening point of the phenol resin (B1) is $T_{B1}$ the absolute value $|T_{A1}-T_{B1}|$ of a temperature difference between $T_{A1}$ and $T_{B1}$ is not more than 35 degrees centigrade.

In the resin composition for encapsulating a semiconductor of the present invention, the resin composition for encapsulating a semiconductor in a tablet form is used for encapsulating a semiconductor element by the transfer molding method.

The semiconductor device of the present invention is obtained by encapsulating a semiconductor element with a cured product of the aforementioned resin composition for encapsulating a semiconductor.

EFFECT OF THE INVENTION

According to the present invention, a resin composition for encapsulating a semiconductor excellent in the flowability and moldability during the molding of a package without damaging the tablet moldability can be obtained.

BRIEF DESCRIPTION OF THE DRAWINGS

The above and other objects, advantages and features of the present invention will be more apparent from the following description of certain preferred embodiments taken in conjunction with the accompanying drawings, in which.

DESCRIPTION OF EMBODIMENTS

Figure 1:
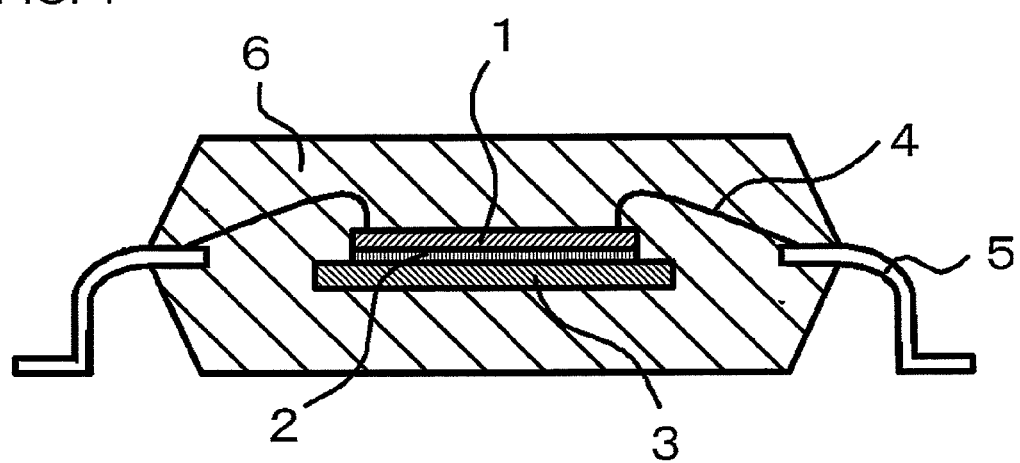
FIG. 1 is a view illustrating a cross-section structure of an example of a semiconductor device using a resin composition for encapsulating a semiconductor according to the present invention.

The present invention relates to a resin composition for encapsulating a semiconductor containing an epoxy resin (A), a curing agent (B) and an inorganic filler (C), wherein the epoxy resin (A) contains an epoxy resin (A1) having a structure represented by the general formula (1), the curing agent (B) contains a phenol resin (B1) represented by the general formula (2), the content of a c=1 component contained in the total amount of the phenol resin (B1) represented by the general formula (2) is not less than 40% in terms of area percentage, and the content of a C≥4 component is not more than 20% in terms of area percentage, as measured by the area method of gel permeation chromatography. Because of this, a resin composition for encapsulating a semiconductor excellent in a balance between the tablet moldability and package moldability is obtained. Hereinafter, the present invention will be described in detail.

First, the resin composition for encapsulating a semiconductor will be described. In the resin composition for encapsulating a semiconductor of the present invention, an epoxy resin (A1) having a structure represented by the following general formula (1) is used as the epoxy resin (A). In the general formula (1), each of substituents R1 and R3 is a hydrocarbon group having 1 to 5 carbon atoms, which may be the same or different from each other, R2 is any of a direct bond, a hydrocarbon group having 1 to 5 carbon atoms, —S— and —O—, and each of a and b is an integer of 0 to 4, which may be the same or different from each other. The epoxy resin (A1) having a structure represented by the general formula (1) has a low melt viscosity because of its small molecular weight, so that the epoxy resin (A1) may exhibit excellent flowability. Examples of such an epoxy resin include diglycidyl ether compounds such as alkyl group-substituted or unsubstituted biphenol, bisphenol A, bisphenol F, bisphenol S, bisphenol A/D, oxybisphenol and the like. Examples of the commercial product include YSLV-80XY (commercially available from Nippon Steel Chemical Co., Ltd., a tetramethyl bisphenol F type epoxy resin), YSLV-120TE (commercially available from Nippon Steel Chemical Co., Ltd., an alkyl group-substituted bisphenol S type epoxy resin represented by the following formula (3)), YX4000H (commercially available from Japan Epoxy Resin Co., Ltd., a tetramethyl biphenol epoxy resin), YL6810 (commercially available from Japan Epoxy Resin Co., Ltd., a bisphenol A type epoxy resin) and the like.

[Chemical Formula 1]

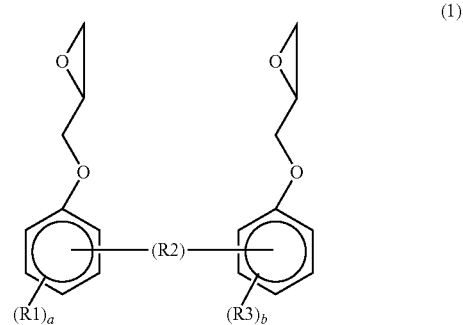

In the above general formula (1), each of R1 and R3 is a hydrocarbon group having 1 to 5 carbon atoms, which may be the same or different from each other; R2 represents any of a direct bond, a hydrocarbon group having 1 to 5 carbon atoms, —S— and —O—; and each of a and b is an integer of 0 to 4, which may be the same or different from each other.

[Chemical Formula 4]

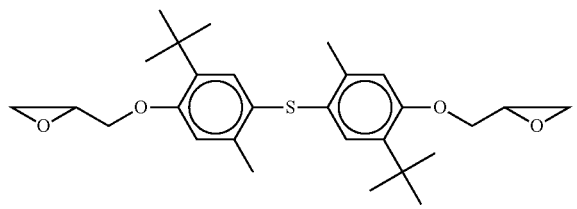

(3)

The epoxy resin (A1) having a structure represented by the general formula (1) is not particularly limited as long as it has the aforementioned structure, but it has a melting point, and its melting point is preferably not less than 40 degrees centigrade and more preferably not less than 45 degrees centigrade. By setting the lower limit of the melting point within the above range, blocking is hardly caused during conveyance or storage of the epoxy resin raw material, and there is little risk of damaging the workability. On the other hand, the upper limit of the melting point is not particularly limited, but it is preferably not more than 140 degrees centigrade and more preferably not more than 125 degrees centigrade. By setting the upper limit of the melting point within the above range, there is little risk of causing failures such as bad curability due to incomplete melting of a resin during melt kneading and the like.

In the resin composition for encapsulating a semiconductor of the present invention, other epoxy resins may be used together in the ranges in which an effect of use of the epoxy resin (A1) having a structure represented by the general formula (1) is not damaged. Examples of the epoxy resin which may be used together include novolac type epoxy resins such as a phenol novolac type epoxy resin, a cresol novolac type epoxy resin and the like; polyfunctional epoxy resins such as a triphenolmethane type epoxy resin, an alkyl-modified triphenolmethane type epoxy resin and the like; aralkyl type epoxy resins such as a phenol aralkyl type epoxy resin having a phenylene skeleton, a naphthol aralkyl type epoxy resin, a phenol aralkyl type epoxy resin having a biphenylene skeleton, a naphthol aralkyl type epoxy resin having a phenylene skeleton and the like; naphthol type epoxy resins such as a dihydroxy naphthalene type epoxy resin, an epoxy resin obtained by glycidyl etherification of dimers of naphthol or dihydroxy naphthalene and the like; triazine nucleus-containing epoxy resins such as triglycidyl isocyanurate, monoallyl diglycidyl isocyanurate and the like; bridged cyclic hydrocarbon compound-modified phenol type epoxy resins such as a dicyclopentadiene-modified phenol type epoxy resin and the like; methoxynaphthalene type epoxy resins; dihydroanthraquinone type epoxy resins; and the like. In consideration of moisture resistance reliability of the resin composition for encapsulating a semiconductor, it is preferable that $Na^+$ ions or $Cl^-$ ions, which are ionic impurities, are contained as small as possible. On the other hand, from the viewpoint of curability, the epoxy equivalent is preferably not less than g/eq and not more than 100 to 500 g/eq.

The mixing ratio of the epoxy resin (A1) having a structure represented by the general formula (1), on condition that other epoxy resins are used together is preferably not less than 25% by mass, more preferably not less than 45% by mass and particularly preferably not less than 60% by mass, based on the total amount of the epoxy resin (A). By setting the mixing ratio within the above range, an effect of improving the flowability may be obtained.

The lower limit of the mixing ratio of the total amount of the epoxy resin (A) is not particularly limited, but it is preferably not less than 2% by mass and more preferably not less than 4% by mass, based on the total amount of the resin composition for encapsulating a semiconductor. By setting the lower limit of the mixing ratio within the above range, there is little risk of causing a reduction in the flowability or the like. On the other hand, the upper limit of the mixing ratio of the total amount of the epoxy resin (A) is not particularly limited, but it is preferably not more than 15% by mass and more preferably not more than 13% by mass, based on the total amount of the resin composition for encapsulating a semiconductor. By setting the upper limit of the mixing ratio within the above range, there is little risk of causing a reduction in solder resistance or the like.

The resin composition for encapsulating a semiconductor of the present invention contains a phenol resin (B1) represented by the following general formula (2) as the curing agent (B), wherein the content of the $c=1$ component contained in the total amount of the phenol resin (B1) represented by the general formula (2) is not less than 40% in terms of area percentage, and the content of a $C≥4$ component is not more than 20% in terms of area percentage, as measured by the area method of gel permeation chromatography. Furthermore, the content of the $c=0$ component contained in the total amount of the phenol resin (B1) represented by the general formula (2) is preferably not more than 16% in terms of area percentage. Here, the total amount of the phenol resin (B1) represented by the general formula (2) refers to the total amount of one or more phenol resins represented by the general formula (2) contained in the resin composition for encapsulating a semiconductor, regardless of the contents of the $c=1$ component, $c≥4$ component and $c=0$ component. In the phenol resin (B1) represented by the general formula (2), the $c=0$ component of the general formula (2) exhibits a low viscosity, but the number of hydroxyl groups in one molecule is two. So, when it is melt-kneaded especially with a bifunctional epoxy resin such as the epoxy resin (A1), the cohesive force among molecules is not sufficient. Thus, the strength of the tablet might possibly be lowered and a crosslinked structure is hardly obtained after curing as well. The $c=1$ component exhibits a low viscosity next to the $c=0$ component and the number of hydroxyl groups in one molecule is three, so that the melt kneading is easy, a bifunctional epoxy resin such as the epoxy resin (A1) in a resin composition state exhibits excellent cohesive force, and a three-dimensional crosslinked structure can be formed after curing as well. With an increase of the number of c, the viscosity becomes high, and the melt-kneading property and flowability become poor. Particularly by setting the repeating unit to be $c≥4$, further the reactivity with a bifunctional epoxy resin such as the epoxy resin (A1) tends to be poor due to its steric hindrance. In the resin composition for encapsulating a semiconductor of the present invention, the lower limit of the content of the $c=1$ component contained in the total amount of the phenol resin (B1) represented by the general formula (2) is preferably not less than 40%, more preferably not less than 50% and particularly preferably not less than 55% in terms of area percentage. By setting the lower limit of the content of the $c=1$ component within the above range, there is little risk of causing a deterioration of the tablet yield rate and the flowability of the resin composition may be improved. The upper limit of the content of the $c=1$ component is not particularly limited, but it is preferably not more than 85% and more preferably not more than 80% in terms of area percentage. By setting the upper limit of the $c=1$ component within the above range, there is little risk of causing an increase in the cost due to excessively low synthesis yield of the phenol resin (B1) represented by the general formula (2). The upper limit of the content of the C≥4 component contained in the total amount of the phenol resin (B1) represented by the general formula (2) is not particularly limited, but it is preferably not more than 20% and more preferably not more than 15% in terms of area percentage. By setting the upper limit of the content of the C≥4 component within the above range, there is little risk of causing a decrease in the flowability. The upper limit of the content of the c=0 component contained in the total amount of the phenol resin (B1) represented by the general formula (2) is not particularly limited, but it is preferably not more than 16% and more preferably not more than 12% in terms of area percentage. By setting the upper limit of the content of the c=0 component within the above range, there is little risk of causing breaking, cracking or poor appearance during tablet molding. Incidentally, the contents of the aforementioned respective components may be determined as measured by the area method of gel permeation chromatography to be described below.

[Chemical Formula 5]

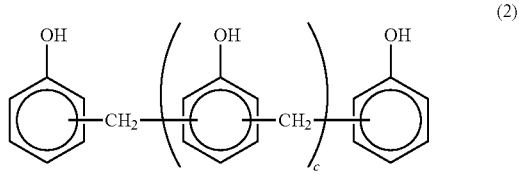

(2)

wherein, in the above general formula (2), c is an integer of 0 to 20.

In the present invention, the lower limit of the softening point of the phenol resin (B1) represented by the general formula (2) is not particularly limited as long as the phenol resin (B1) represented by the general formula (2) has the aforementioned structure and the contents of the c=1 component and the c≥4 component are in the above ranges. However, it is preferably not less than 50 degrees centigrade and more preferably not less than 60 degrees centigrade. By setting the lower limit of the softening point within the above range, blocking is hardly caused during conveyance or storage of the epoxy resin raw material, and there is little risk of damaging the workability. Meanwhile, the upper limit of the softening point is not particularly limited, but it is preferably not more than 140 degrees centigrade and more preferably not more than 125 degrees centigrade. By setting the upper limit of the softening point within the above range, there is little risk of causing failures such as bad curability due to incomplete melting of a resin during melt kneading and the like.

In the phenol resin (B1) represented by the general formula (2), the content of the c=1 component, the content of the C≥4 component and the content of the c=0 component of the general formula (2) may be calculated in the following manner. The phenol resin (B1) represented by the general formula (2) is subjected to gel permeation chromatography (GPC) measurement, the molecular weights of respective components in terms of polystyrene corresponding to the detected peaks are determined, and the contents (area percentage) of respective components corresponding to the peaks detected from the ratio of the detected peak areas are calculated.

In the present invention, gel permeation chromatography (GPC) is measured in the following manner. A GPC device is equipped with a pump, an injector, a guard column, a column and a detector. Tetrahydrofuran (THF) is used as a solvent. The molecular weight is measured at the flow rate of the pump of 0.5 ml/min. The flow rate of higher than that is not preferable because the detection accuracy of a desired molecular weight is low. Furthermore, in order to carry out the measurement with good accuracy at the above flow rate, there is a need to use a pump with good flow rate accuracy, and the flow rate accuracy is preferably not more than 0.10%. A plurality of commercial guard columns (for example, TSK GUARD-COLUMN HHR-L, commercially available from Tosoh Corporation, diameter: 6.0 mm, pipe length: 40 mm) as a guard column and a plurality of commercial polystyrene gel columns (TSK-GEL GMHHR-L, commercially available from Tosoh Corporation, diameter: 7.8 mm, pipe length: 30 mm) as a column are serially connected. A differential refractometer (RI detector, for example, differential refractive index (RI) detector, W2414, commercially available from Waters) is used as a detector. Before the measurement, the guard column, column and detector inside are stabilized at a temperature of 40 degrees centigrade. A THF solution of the epoxy resin (A) in which its concentration is adjusted to 3 to 4 mg/ml is prepared as a sample and the solution is injected from an injector of about 50 to 150 μl for the measurement. For the analysis of the sample, a calibration curve produced by the use of a monodispersed standard polystyrene (hereinafter referred to as PS) standard sample is used. The calibration curve is obtained by plotting the logarithmic value of the PS molecular weight versus the peak detection time (retention time), and making a straight line using a regression equation. As the standard PS sample for producing a calibration curve, there are used Model S-1.0 (peak molecular weight: 1,060), S-1.3 (peak molecular weight: 1,310), S-2.0 (peak molecular weight: 1,990), S-3.0 (peak molecular weight: 2,970), S-4.5 (peak molecular weight: 4,490), S-5.0 (peak molecular weight: 5,030), S-6.9 (peak molecular weight: 6,930), S-11 (peak molecular weight: 10,700) and S-20 (peak molecular weight: 19,900), all of which are Shodex standard SL-105 series commercially available from Showa Denko K.K.

In the present invention, the polymerization method and the method of controlling the amounts of the components are not particularly limited as long as the phenol resin (B1) is represented by the structure of the general formula (2), and the amounts of the c=1 component and c≥4 component are within the above ranges. As the polymerization method, there may be exemplified a method including subjecting phenol and formaldehyde to polycondensation in the presence of an acid catalyst, and then distilling off residual monomer and moisture. A commercial phenol novolac resin may also be used. Furthermore, in order to control the contents of the c=1 component, c≥4 component and c=0 component of the general formula (2), distillation, washing, extraction, column chromatography fractionation, mixing of phenol novolac having a predetermined molecular weight distribution or the like to be described below may be used.

As the above phenol, a solution obtained by diluting commercial phenol monomer or phenol with a solvent or the like may be used, and preferably used is phenol for industrial use in view of the cost. As the aforementioned formaldehyde, a substance which is a formaldehyde generation source, such as an aqueous solution of para-formaldehyde, trioxane, formaldehyde or the like, or a solution of such formaldehydes may be used. Usually, use of an aqueous solution of formaldehyde is preferable in view of the workability and the cost. In addition thereto, as a synthetic raw material, a polymer subjected to polycondensation in the presence of an acid catalyst using phenol and aldehyde in advance, a distillate, an extract, a molecular weight fraction or a bottoms product thereof may be used. In addition, commercial bisphenol F or a phenol novolac resin may also be used together.

As the above acid catalyst, an acid catalyst known in the usual synthesis of a phenol novolac resin can be used. Examples include inorganic acids such as sulfuric acid, hydrochloric acid, phosphoric acid, phosphorous acid and the like; organic acids such as oxalic acid, formic acid, organic phosphonate, para-toluenesulfonic acid, dimethyl sulfate and the like; zinc acetate, nickel acetate and the like. These may be used either individually or in combination of two or more kinds. Among these, preferably used are oxalic acid and hydrochloric acid because a catalyst is easily removed from a phenol resin.

In the polycondensation of phenol and formaldehyde, the reaction molar ratio of formaldehyde (F) to phenol (P) (F/P molar ratio) and the reaction temperature are not particularly limited, but it is preferable that the F/P molar ratio is usually in the range of 0.05 to 0.7 moles and the reaction temperature is in the range of 50 to 150 degrees centigrade for the reaction. Herein, by lowering the reaction molar ratio (the F/P molar ratio) or the reaction temperature, it is possible to reduce the average molecular weight and control the amount of the $c \geq 4$ component to be low.

The aforementioned method of controlling the molecular weight by distillation is not particularly limited, but examples of the distillation procedure include atmospheric distillation, vacuum distillation, steam distillation and the like. The distillation procedure is preferably carried out at a temperature of not less than 50 degrees centigrade and not more than 250 degrees centigrade. When the distillation temperature herein is less than 50 degrees centigrade, the efficiency by distillation is worsened, which is not preferable in view of the productivity. When the temperature exceeds 250 degrees centigrade, such a temperature is not preferable because of decomposition of the phenol novolac resin and high molecular weight. Specifically, by the atmospheric distillation at 100 to 150 degrees centigrade, the moisture may be removed with good efficiency, by the vacuum distillation under the conditions of a temperature of 150 to 200 degrees centigrade and a pressure of 5,000 Pa, the phenol monomer component may be removed with good efficiency, and by the vacuum steam distillation under the conditions of a temperature of 200 to 250 degrees centigrade and a pressure of 5,000 Pa, the $c=0$ component of the general formula (2) may be removed with good efficiency. Or, by the proper combination of these, the content of the $c=1$ component of the general formula (2) may be increased.

As the aforementioned method of controlling the molecular weight by washing, specifically, water is added to a phenol novolac resin or a phenol novolac resin which is dissolved in an organic solvent, and the resulting mixture is stirred at a temperature of 20 to 150 degrees centigrade at ordinary pressure or under pressure to separate an aqueous phase and an organic phase by allowing to stand or centrifugal separation, and to remove the aqueous phase out of the system, whereby it is possible to reduce the low molecular component dissolved in the aqueous phase, mainly the phenol monomer component and the $c=0$ component of the general formula (2). By these procedures, as a result, the amount of the $c=1$ component of the general formula (2) can be controlled.

As the aforementioned method of controlling the molecular weight by extraction, a nonpolar solvent having a low solubility to a phenol resin such as toluene, xylene or the like is added to a phenol novolac resin, an aqueous solution of a phenol novolac resin, or a phenol resin dissolved in a polar solvent such as alcohol or the like, and the resulting mixture is stirred at a temperature of 20 to 150 degrees centigrade at ordinary pressure or under pressure to separate a nonpolar solvent phase and other component phase by allowing to stand or centrifugal separation, and to remove the nonpolar solvent phase out of the system, whereby it is possible to remove the high molecular weight component dissolved in the nonpolar solvent phase. By these procedures, as a result, the amount of the $c \geq 4$ component can be reduced and controlled.

As the aforementioned method of controlling the molecular weight by fractionating column, a refractive index (RI) detector and a valve for collecting separated liquid are serially connected to a separatory funnel and a fractionating column filled with a polystyrene gel, a tetrahydrofuran solution of a phenol novolac resin is supplied from the separatory funnel, a tetrahydrofuran eluent is supplied, a refractive index (RI) chart is monitored, and a predetermined peak is detected. Thereafter, an extracting solution is collected until it is varnished, whereby an arbitrary molecular weight component may be collected.

The aforementioned method of controlling the molecular weight by mixing is not particularly limited. However, it is possible to control the amounts of the $c=1$ component, $c \geq 4$ component and $c=0$ component of the formula (2) by the use of a polymer subjected to polycondensation in the presence of an acid catalyst using phenol and formaldehyde, or commercial phenol novolac resins which are subjected to a process such as distillation, extraction, precipitation, fractionation or the like, followed by melt-blending a plurality of these resins at a temperature of not less than the melting point, or dissolving the resins in a solvent for mixing and removing the solvent under reduced pressure. In this case, an individual resin alone may contain the $c=1$ component and $c \geq 4$ component in the amount out of the above range.

In the resin composition for encapsulating a semiconductor of the present invention, other curing agents may be used together in the ranges in which an effect by the use of the phenol resin (B1) is not damaged. Examples of the curing agent which may be used together include a polyaddition type curing agent, a catalyst type curing agent, a condensation type curing agent and the like. Examples of the polyaddition type curing agent include polyamine compounds containing dicyandiamide (DICY), organic dihydrazide and the like; acid anhydrides containing alicyclic acid anhydride such as hexahydrophthalic anhydride (HHPA), methyl tetrahydrophthalic anhydride (MTHPA) and the like, aromatic acid anhydride such as trimellitic anhydride (TMA), pyromellitic anhydride (PMDA), benzophenonetetracarboxylic acid (BTDA) and the like; phenol resin compounds such as a phenol aralkyl resin, a dicyclopentadiene-modified phenol resin and the like; polymercaptan compounds such as polysulfide, thioester, thioether and the like; isocyanate compounds such as isocyanate prepolymer, blocked isocyanate and the like; and organic acids such as a carboxylic acid-containing polyester resin and the like, in addition to aliphatic polyamines such as diethylenetriamine (DETA), triethylenetetramine (TETA), meta-xylenediamine (MXDA) and the like, and aromatic polyamines such as diaminodiphenyl methane (DDM), m-phenylenediamine (MPDA), diaminodiphenyl sulfone (DDS) and the like. As the curing agent which may be used together in the resin composition for encapsulating a semiconductor of the present invention, preferably used is a phenol resin type curing agent from the viewpoint of a balance among flame resistance, moisture resistance, electrical properties, curability, storage stability and the like. Such a phenol resin type curing agent may generally be monomers, oligomers or polymers having two or more phenolic hydroxyl groups in one molecule. The molecular weight and molecular structure thereof are not particularly limited, and examples include novolac type resins such as a cresol novolac resin and the like; polyfunctional phenol resins such as a triphenolmethane type phenol resin and the like; modified phenol resins such as a terpene-modified phenol resin, a dicyclopentadiene-modified phenol resin and the like; aralkyl type resins such as a phenol aralkyl resin having a phenylene skeleton and/or a biphenylene skeleton, a naphthol aralkyl resin having a phenylene skeleton and/or a biphenylene skeleton and the like; and bisphenol compounds such as bisphenol A, bisphenol AD and the like. Among these, from the viewpoint of curability, for example, the hydroxyl equivalent of the phenol resin type curing agent is preferably not less than 90 g/eq and not more than 250 g/eq.

The lower limit of the mixing ratio of the total amount of the curing agent (B) is not particularly limited, but it is preferably not less than 0.8% by mass and more preferably not less than 1.5% by mass, based on the total amount of the resin composition for encapsulating a semiconductor. By setting the lower limit of the mixing ratio within the above range, sufficient flowability may be achieved. On the other hand, the upper limit of the mixing ratio of the total amount of the curing agent (B) is not particularly limited, but it is preferably not more than 10% by mass and more preferably not more than 8% by mass, based on the total amount of the resin composition for encapsulating a semiconductor. By setting the upper limit of the mixing ratio within the above range, excellent solder resistance may be achieved.

Meanwhile, when the phenol resin type curing agent is used as the curing agent (B), as the mixing ratio of the total epoxy resin and the total phenol resin type curing agent, the equivalent ratio (EP)/(OH) of the number of epoxy groups (EP) in the total amount of the epoxy resin (A) to the number of phenolic hydroxyl groups (OH) in the total amount of the phenol resin type curing agent is preferably not less than 0.8 and not more than 1.3. By setting the equivalent ratio within this range, sufficient curability may be obtained during the molding of the resin composition for encapsulating a semiconductor. Furthermore, by setting the equivalent ratio within this range, excellent physical properties in a resin cured product may be obtained.

In the resin composition for encapsulating a semiconductor of the present invention, the epoxy resin (A1) has a melting point, and on condition that its melting point is $T_{A1}$ and the softening point of the phenol resin (B1) represented by the general formula (2) is $T_{B1}$, the absolute value $|T_{A1}-T_{B1}|$ of a temperature difference between $T_{A1}$ and $T_{B1}$ is preferably not more than 35 degrees centigrade and more preferably not more than 30 degrees centigrade. By setting the temperature difference of the melting point of the epoxy resin (A1) and the softening point of the phenol resin (B1) represented by the general formula (2) within the above range, excellent tablet moldability may be obtained. It is hard to clearly describe the reason for improvement of the tablet moldability and yield rate By setting the aforementioned temperature difference to be made small, but it is considered that the epoxy resin (A1) and the phenol resin (B1) represented by the general formula (2) are promptly melt-blended in a melt kneading process of the resin composition and as a result, the cohesive force between the epoxy resin after cooling and the curing agent is improved. On the other hand, by setting the melting point of the crystalline epoxy resin to be exceedingly high, it is not sufficiently mixed with the curing agent component without proceeding with melting rapidly. By setting the melting point of the crystalline epoxy resin to be exceedingly low, although the epoxy resin is easily melted at a low temperature as compared to other components, it is not sufficiently mixed with the curing agent and the cohesive force becomes insufficient without the addition of sufficient gel during heat-blending. The lower limit of the softening point and the melting point of other epoxy resin and other curing agent which are used together with the epoxy resin (A1) and the phenol resin (B1) is preferably not less than 50 degrees centigrade and more preferably not less than 60 degrees centigrade. The upper limit of the softening point and the melting point of other epoxy resin and other curing agent which are used together with the epoxy resin (A1) and the phenol resin (B1) is not particularly limited, but it is preferably not more than 140 degrees centigrade and more preferably not more than 125 degrees centigrade. By setting the softening point and the melting point of other epoxy resin and other curing agent which are used together with the epoxy resin (A1) and the phenol resin (B1) to be within the above ranges, there is little risk of causing failures such as poor appearance, damage and the like of tablets due to incomplete melting of the resin during melt kneading.

The resin composition for encapsulating a semiconductor of the present invention may further contain an inorganic filler (C). As the inorganic filler (C) which may be used in the resin composition for encapsulating a semiconductor of the present invention, inorganic fillers which are generally used for the resin composition for encapsulating a semiconductor may be used. Examples include fused silica, spherical silica, crystalline silica, alumina, silicon nitride, aluminum nitride and the like. The particle diameter of the inorganic filler (C) is preferably not less than 0.01 μm and not more than 150 μm in consideration of filling properties into a mold cavity.

The lower limit of the content of the inorganic filler (C) is preferably not less than 75% by mass, more preferably not less than 80% by mass and particularly preferably not less than 83% by mass, based on the total amount of the resin composition for encapsulating a semiconductor. By setting the lower limit of the content of the inorganic filler (C) within the above range, the resin composition for encapsulating a semiconductor exhibits excellent tablet moldability, and achieves excellent soldering crack resistance as physical properties of a cured product without increasing the moisture content and lowering the strength. The upper limit of the content of the inorganic filler (C) is preferably not more than 93% by mass, more preferably not more than 91% by mass, and particularly preferably not more than 90% by mass, based on the total amount of the resin composition for encapsulating a semiconductor. By setting the upper limit of the content of the inorganic filler (C) within the above range, excellent moldability may be achieved without damaging the flowability.

The resin composition for encapsulating a semiconductor of the present invention may further contain a curing accelerator (D). The curing accelerator (D) may be any compound which can accelerate a reaction between an epoxy group in the epoxy resin and a phenolic hydroxyl group in a compound having two or more phenolic hydroxyl groups, and may be selected from those curing accelerators commonly used for the resin composition for encapsulating a semiconductor. Specific examples include phosphorous-containing compounds such as organic phosphine, a tetra-substituted phosphonium compound, a phosphobetaine compound, an adduct of a phosphine compound and a quinone compound, an adduct of a phosphonium compound and a silane compound and the like; and nitrogen-containing compounds such as 1,8-diazabicyclo(5,4,0)undecene-7, benzyldimethylamine, 2-methylimidazole and the like. Among these, preferably used are phosphorous-containing compounds, and more preferably used are catalysts having latency such as a tetra-substituted phosphonium compound, a phosphobetaine compound, an adduct of a phosphine compound and a quinone compound, and an adduct of a phosphonium compound and a silane compound and the like, in view of a balance between the flowability and curability. In consideration of the flowability, particularly preferably used is a tetra-substituted phosphonium compound. In consideration of low thermal time elastic modulus of a cured product of the resin composition for encapsulating a semiconductor, particularly preferably used are a phosphobetaine compound, and an adduct of a phosphine compound and a quinone compound. Furthermore, in consideration of the latent curability, particularly preferably used is an adduct of a phosphonium compound and a silane compound.

Examples of the organic phosphines which may be used for the resin composition for encapsulating a semiconductor of the present invention include primary phosphines such as ethylphosphine, phenylphosphine and the like; secondary phosphines such as dimethylphosphine, diphenylphosphine and the like; and tertiary phosphines such as trimethylphosphine, triethylphosphine, tributylphosphine, triphenylphosphine and the like.

Examples of the tetra-substituted phosphonium compound which may be used in the resin composition for encapsulating a semiconductor of the present invention include compounds represented by the following general formula (4),

[Chemical Formula 6]

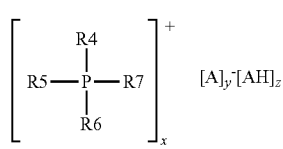

(4)

wherein, in the above general formula (4), P represents a phosphorus atom; R4, R5, R6 and R7 each independently represent an aromatic group or an alkyl group; A represents an anion of an aromatic organic acid in which at least one functional group selected from a hydroxyl group, a carboxyl group and a thiol group is bonded to an aromatic ring; AH represents an aromatic organic acid in which at least one functional group selected from a hydroxyl group, a carboxyl group and a thiol group is bonded to an aromatic ring; x and y are each an integer of 1 to 3; z is an integer of 0 to 3; and x=y.

The compound represented by the general formula (4) is obtained, for example, in the following manner, but the method is not restricted thereto. First, a tetra-substituted phosphonium halide, an aromatic organic acid and a base are added to an organic solvent and uniformly mixed to produce an aromatic organic acid anion in the solution system. Subsequently, when water is added to the solution, the compound represented by the general formula (4) may be precipitated. In the compound represented by the general formula (4), R4, R5, R6 and R7 bonded to a phosphorus atom are each preferably a phenyl group, and AH is preferably a compound in which a hydroxyl group is bonded to an aromatic ring, namely, a phenol compound, and A is preferably an anion of the phenol compound.

Examples of the phosphobetaine compound which may be used for the resin composition for encapsulating a semiconductor of the present invention include compounds represented by the following general formula (5),

[Chemical Formula 7]

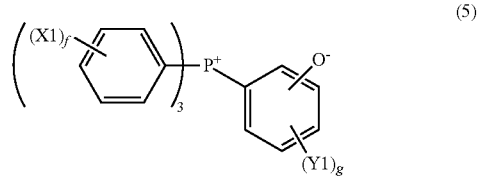

(5)

wherein, in the above general formula (5), X1 represents an alkyl group having 1 to 3 carbon atoms; Y1 represents a hydroxyl group; f is an integer of 0 to 5; and g is an integer of 0 to 3.

The compound represented by the general formula (5) is obtained, for example, in the following manner. First, it is obtained through a step in which a triaromatic-substituted phosphine, which is a tertiary phosphine, is brought into contact with a diazonium salt to substitute the triaromatic-substituted phosphine and a diazonium group of the diazonium salt. However, the method is not limited to this.

Examples of the adduct of a phosphine compound and a quinone compound which may be used in the resin composition for encapsulating a semiconductor of the present invention include compounds represented by the following general formula (6).

[Chemical Formula 8]

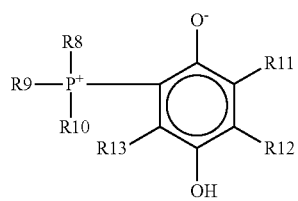

(6)

In the above general formula (6), P represents a phosphorus atom; R8, R9 and R10 each independently represent an alkyl group having 1 to 12 carbon atoms or an aryl group having 6 to 12, which may be the same or different from each other; R11, R12 and R13 each independently represent a hydrogen atom or a hydrocarbon group having 1 to 12 carbon atoms, which may be the same or different from each other; and R11 and R12 may be bonded to each other to form a ring.

Preferable examples of the phosphine compound used for the adduct of a phosphine compound and a quinone compound include unsubstituted aromatic ring-containing phosphines such as triphenylphosphine, tris(alkylphenyl)phosphine, tris(alkoxyphenyl)phosphine, trinaphthylphosphine, tris(benzyl)phosphine and the like; and phosphines containing an aromatic ring substituted with an alkyl group or an alkoxy group. Examples of the alkyl group and the alkoxy group include alkyl groups having 1 to 6 carbon atoms and alkoxy groups having 1 to 6 carbon atoms. From the viewpoint of availability, triphenylphosphine is preferred.

Examples of the quinone compound used for the adduct of a phosphine compound and a quinone compound include o-benzoquinone, p-benzoquinone and anthraquinones. Among these, p-benzoquinone is preferred from the viewpoint of storage stability.

In a method of producing an adduct of a phosphine compound and a quinone compound, an organic tertiary phosphine is brought into contact with a benzoquinone in a solvent that can dissolve both the organic tertiary phosphine and the benzoquinone, and mixed to produce an adduct thereof. Any solvent can be used as long as the solubility into the adduct is low. Examples of the solvent include ketones such as acetone, methyl ethyl ketone and the like, but are not limited thereto.

In the compound represented by the general formula (6), each of R8, R9 and R10, all of which are bonded to a phosphorus atom, is a phenyl group, and each of R11, R12 and R13 is a hydrogen atom. That is, a compound produced by adding 1,4-benzoquinone to triphenylphosphine is preferable because the compound decreases the thermal time elastic modulus of a cured product of the resin composition for encapsulating a semiconductor.

Examples of the adduct of a phosphonium compound and a silane compound which may be used in the resin composition for encapsulating a semiconductor of the present invention include compounds represented by the following general formula (7).

[Chemical Formula 9]

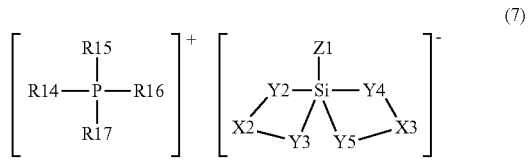

(7)

In the above general formula (7), P represents a phosphorus atom; Si represents a silicon atom; R14, R15, R16 and R17 each independently represent an organic group having an aromatic ring or a heterocyclic ring, or an aliphatic group, which may be the same or different from each other; X2 in the formula is an organic group that bonds group Y2 to group Y3; X3 in the formula is an organic group that bonds group Y4 to group Y5; Y2 and Y3 each represent a group formed by release of a proton from a proton-donating group, and group Y2 and group Y3 in the same molecule are linked with the silicon atom to form a chelate structure; Y4 and Y5 each represent a group formed by release of a proton from a proton-donating group, and group Y4 and group Y5 in the same molecule are linked with the silicon atom to form a chelate structure; X2 and X3 may be the same or different from each other; Y2, Y3, Y4 and Y5 may be the same or different from each other; and Z1 is an organic group having an aromatic ring or a heterocyclic ring, or an aliphatic group.

Examples of R14, R15, R16 and R17 in the general formula (7) include a phenyl group, a methylphenyl group, a methoxyphenyl group, a hydroxyphenyl group, a naphthyl group, a hydroxynaphthyl group, a benzyl group, a methyl group, an ethyl group, an n-butyl group, an n-octyl group, a cyclohexyl group and the like. Among these, more preferably used are aromatic groups having a substituent and unsubstituted aromatic groups, such as a phenyl group, a methylphenyl group, a methoxyphenyl group, a hydroxyphenyl group, a hydroxynaphthyl group or the like.

Furthermore, in the general formula (7), X2 is an organic group that bonds group Y2 to group Y3. Similarly, X3 is an organic group that bonds group Y4 to group Y5. Y2 and Y3 are each a group formed by release of a proton from a proton-donating group, and group Y2 and group Y3 in the same molecule are linked with the silicon atom to form a chelate structure. Similarly, Y4 and Y5 are each a group formed by release of a proton from a proton-donating group, and group Y4 and group Y5 in the same molecule are linked with the silicon atom to form a chelate structure. The group X2 and group X3 may be the same or different from each other, and group Y2, group Y3, group Y4 and group Y5 may be the same or different from each other. The group represented by —Y2-X2-Y3- and the group represented by —Y4-X3-Y5- in the general formula (7) are each a group formed by release of two protons from a proton donor. Examples of the proton donor include catechol, pyrogallol, 1,2-dihydroxynaphthalene, 2,3-dihydroxynaphthalene, 2,2'-biphenol, 1,1'-bi-2-naphthol, salicylic acid, 1-hydroxy-2-naphthoic acid, 3-hydroxy-2-naphthoic acid, chloranilic acid, tannic acid, 2-hydroxybenzyl alcohol, 1,2-cyclohexanediol, 1,2-propanediol, glycerin and the like. Among these, more preferably used are catechol, 1,2-dihydroxynaphthalene and 2,3-dihydroxynaphthalene.

Furthermore, Z1 in the general formula (7) represents an organic group having an aromatic ring or a heterocyclic ring, or an aliphatic group. Specific examples of Z1 include aliphatic hydrocarbon groups such as a methyl group, an ethyl group, a propyl group, a butyl group, a hexyl group, an octyl group and the like; aromatic hydrocarbon groups such as a phenyl group, a benzyl group, a naphthyl group, a biphenyl group and the like; and reactive substituents such as a glycidyloxypropyl group, a mercaptopropyl group, an aminopropyl group, a vinyl group and the like. Among these, more preferably used are a methyl group, an ethyl group, a phenyl group, a naphthyl group and a biphenyl group from the viewpoint of thermal stability.

As a method of producing an adduct of a phosphonium compound and a silane compound, a silane compound such as phenyltrimethoxysilane and a proton donor such as 2,3-dihydroxynaphthalene are added to methanol in a flask and dissolved. Next, a sodium methoxide-methanol solution is added dropwise thereto under stirring at room temperature. A solution prepared by dissolving a tetra-substituted phosphonium halide such as tetraphenyl phosphonium bromide in methanol in advance is added dropwise to the resulting reaction product under stirring at room temperature to precipitate crystals. When the precipitated crystals are filtered, washed with water, and then dried in vacuum, an adduct of a phosphonium compound and a silane compound is obtained. However, the method is not limited to this.

The mixing ratio of the curing accelerator (D) which may be used for the resin composition for encapsulating a semiconductor of the present invention is more preferably not less than 0.1% by mass and not more than 1% by mass, based on the total amount of the resin composition. By setting the mixing ratio of the curing accelerator (D) within the above range, sufficient curability may be achieved. Furthermore, by setting the mixing ratio of the curing accelerator (D) within the above range, sufficient flowability may be achieved.

In the present invention, a compound (E) in which a hydroxyl group is bonded to each of two or more adjacent carbon atoms constituting an aromatic ring may be further used. The compound (E) in which a hydroxyl group is bonded to each of two or more adjacent carbon atoms constituting an aromatic ring (hereinafter referred to as the compound (E)) is used as a curing accelerator for accelerating a crosslinking reaction between the epoxy resin (A) and the curing agent (B). Thus, even if a phosphorus-containing curing accelerator without having latency is used, the reaction of the resin composition during the melt kneading may be suppressed with the use of the compound (E), so that a stabilized resin composition for encapsulating a semiconductor can be obtained. Furthermore, the compound (E) also has an effect of decreasing the melt viscosity of the resin composition for encapsulating a semiconductor and increasing the flowability. Examples of the compound (E) include a monocyclic compound represented by the following general formula (8), a polycyclic compound represented by the following general formula (9) and the like, and these compounds may have a substituent other than a hydroxyl group.

[Chemical Formula 10]

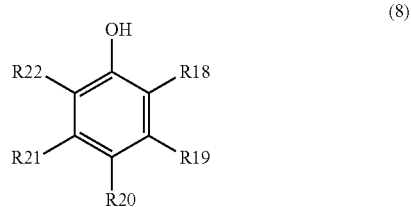

(8)

In the above general formula (8), any one of R18 and R22 is a hydroxyl group, on condition that one of R18 and R22 is a hydroxyl group, the other is a hydrogen atom, a hydroxyl group or a substituent other than a hydroxyl group; and R19, R20 and R21 are each a hydrogen atom, a hydroxyl group or a substituent other than a hydroxyl group.

[Chemical Formula 11]

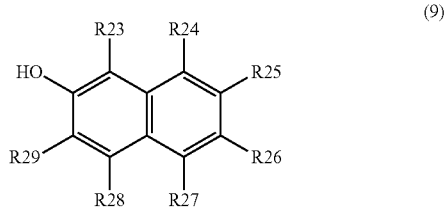

(9)

In the above general formula (9), any one of R23 and R29 is a hydroxyl group, on condition that one of R23 and R29 is a hydroxyl group, the other is a hydrogen atom, a hydroxyl group or a substituent other than a hydroxyl group; and R24, R25, R26, R27 and R28 are each a hydrogen atom, a hydroxyl group or a substituent other than a hydroxyl group.

Concrete examples of the monocyclic compound represented by the general formula (8) include catechol, pyrogallol, gallic acid, gallic acid esters and their derivatives. Concrete examples of the polycyclic compound represented by the general formula (9) include 1,2-dihydroxynaphthalene, 2,3-dihydroxynaphthalene and their derivatives. Among these, from the viewpoint of ease of control of flowability and curability, preferably used is a compound in which a hydroxyl group is bonded to each of two or more adjacent carbon atoms constituting an aromatic ring. Furthermore, in consideration of volatilization in a step of kneading, more preferably used is a compound having, as a mother nucleus, a naphthalene ring, which has low volatility and high weighing stability. In this case, the compound (E) may be specifically, for example, a compound having a naphthalene ring such as 1,2-dihydroxynaphthalene, 2,3-dihydroxynaphthalene and their derivatives. These compounds (E) may be used either individually or may be used in combination of two or more kinds.

The mixing ratio of the compound (E) is preferably not less than 0.01% by mass and not more than 1% by mass, more preferably not less than 0.03% by mass and not more than 0.8% by mass, and particularly preferably not less than 0.05% by mass and not more than 0.5% by mass, based on the total amount of the resin composition for encapsulating a semiconductor. By setting the lower limit of the mixing ratio of the compound (E) within the above range, a resin composition for encapsulating a semiconductor with an effect of improving sufficient low viscosity and flowability can be obtained. By setting the upper limit of the mixing ratio of the compound (E) within the above range, there is little risk of causing deterioration in the curability and deterioration in physical properties of a cured product of the resin composition for encapsulating a semiconductor.

In the resin composition for encapsulating a semiconductor of the present invention, for the purpose of improving adhesion between the epoxy resin (A) and the inorganic filler (C), an adhesion auxiliary agent (F) such as a silane coupling agent or the like may be further added. The coupling agent is not particularly limited, and examples thereof include epoxysilane, aminosilane, ureidosilane, mercaptosilane and the like. The adhesion auxiliary agent (F) may be good as long as it reacts between the epoxy resin and the inorganic filler to improve the interfacial strength between the epoxy resin and the inorganic filler. Furthermore, when the silane coupling agent may be used together with the above-stated compound (E), the compound (E) reduces the melt viscosity of the resin composition for encapsulating a semiconductor and improves the flowability by the synergic effect with the coupling agent.

Concrete examples of the epoxysilane include γ-glycidoxypropyltriethoxysilane, γ-glycidoxypropyltrimethoxysilane, γ-glycidoxypropylmethyldimethoxysilane, β-(3,4-epoxycyclohexyl)ethyltrimethoxysilane and the like. Examples of the aminosilane include γ-aminopropyltriethoxysilane, γ-aminopropyltrimethoxysilane, N-β(aminoethyl)γ-aminopropyltrimethoxysilane, N-β(aminoethyl)γ-aminopropylmethyldimethoxysilane, N-phenylγ-aminopropyltriethoxysilane, N-phenylγ-aminopropyltrimethoxysilane, N-β(aminoethyl) γ-aminopropyltriethoxysilane, N-6-(aminohexyl)-3-aminopropyltrimethoxysilane, N-(3-(trimethoxysilylpropyl)-1,3-benzenedimethanane and the like. Examples of the ureidosilane include γ-ureidopropyltriethoxysilane, hexamethyldisilazane and the like. Examples of the mercaptosilane include γ-mercaptopropyltrimethoxysilane and the like. These silane coupling agents may be used either individually or in combination of two or more kinds.

The mixing ratio of the adhesion auxiliary agent (F) such as a silane coupling agent or the like which may be used for the resin composition for encapsulating a semiconductor of the present invention is preferably not less than 0.01% by mass and not more than 1% by mass, more preferably not less than 0.05% by mass and not more than 0.8% by mass, and particularly preferably not less than 0.1% by mass and not more than 0.6% by mass, based on the total amount of the resin composition. By setting the mixing ratio of the adhesion auxiliary agent (F) such as a silane coupling agent or the like to be not less than the above lower limit, excellent soldering crack resistance in the semiconductor device may be achieved without lowering the interfacial strength between the epoxy resin and the inorganic filler. Furthermore, by setting the mixing ratio of the adhesion auxiliary agent (F) such as a silane coupling agent or the like to be within the above range, excellent soldering crack resistance in the semiconductor device may be achieved without increasing moisture absorption of the cured product of the resin composition.

The resin composition for encapsulating a semiconductor of the present invention, in addition to the aforementioned components, may further properly contain additives, for example, a coloring agent such as carbon black, bengala, titanium oxide or the like; a releasing agent such as natural wax, for example, carnauba wax or the like, synthetic wax, for example, polyethylene wax or the like, higher fatty acid and metal salt thereof, for example, stearic acid, zinc stearate or the like, or paraffin; a low-stress additive such as silicon oil, silicon rubber or the like; an inorganic ion-exchanger such as bismuth oxide hydrate or the like; metal hydroxide such as aluminum hydroxide, magnesium hydroxide or the like; and a flame retardant such as zinc borate, zinc molybdate, phosphazene, antimony trioxide or the like.

The method for producing a resin composition for encapsulating a semiconductor of the present invention is not particularly limited, but the aforementioned components and other additives are mixed in a predetermined amount. The mixture is homogeneously pulverized and mixed at a normal temperature using, for example, a mixer, a jet mill, a ball mill or the like, and thereafter the homogenous mixture is melt-kneaded using a kneading machine such as a hot roll, a kneader or an extruder, while heating the resin composition to about 90 to 120 degrees centigrade. The previously kneaded resin composition is cooled and pulverized, whereby a granular or powdery resin composition can be obtained. The particle size of powder or granule of the resin composition is preferably not more than 5 mm. When it exceeds 5 mm, variations in the weight of tablets caused by bad filling during tableting may be increased.

Furthermore, powder or granule of the obtained resin composition is molded into tablets, whereby tablets can be obtained. As a device used for tablet molding, a unitary or multiple rotary tablet press may be used. The shape of the tablet is not particularly limited, but preferably used is a cylindrical shape. The temperature of a pounder, a mortar and environment of the tablet press is not particularly limited, but it is preferably not more than 35 degrees centigrade. When it exceeds 35 degrees centigrade, the viscosity of the resin composition is increased by the reaction, so that there is the risk of deteriorating the flowability. The tableting pressure is preferably in the range of $400 \times 10^4$ to $3,000 \times 10^4$ Pa. When the tableting pressure exceeds the above upper limit, there is the risk of causing breaking immediately after tableting. When the tableting pressure fails to satisfy the lower limit, sufficient cohesive force is not obtained so that there is the risk of breaking the tablets during conveyance. The material of a mold of a pounder and a mortar of the tablet press and the surface treatment are not particularly limited. Known quality materials may be used and examples of the surface treatment include electric discharge, coating of a releasing agent, plating, polishing and the like.

Next, the semiconductor device of the present invention will be described. In order to produce a semiconductor device obtained by encapsulating a semiconductor element with a cured product of the resin composition for encapsulating a semiconductor of the present invention, for example, the resin composition for encapsulating a semiconductor may be molded and cured by a molding method such as transfer molding, compression molding, injection molding or the like, after a lead frame or a circuit board on which a semiconductor element is mounted is placed in a mold cavity.

Examples of the semiconductor element to be encapsulated in the semiconductor device of the present invention is not particularly limited, and examples include integrated circuits, large scale integrated circuits, transistors, thyristors, diodes, solid-state image sensing devices and the like.

The shape of the semiconductor device of the present invention is not particularly limited, and examples include a dual inline package (DIP), a plastic leaded chip carrier (PLCC), a quad flat package (QFP), a low-profile quad flat package (LQFP), a small outline package (SOP), a small outline J-lead package (SOJ), a thin small outline package (TSOP), a thin quad flat package (TQFP), a tape carrier package (TCP), a ball grid array (BGA), a chip size package (CSP) and the like, but are not restricted thereto.

The semiconductor device of the present invention obtained by encapsulating a semiconductor element with a cured product of the resin composition for encapsulating a semiconductor by a molding method such as transfer molding or the like is mounted on any electronic apparatus without curing or after completely curing the resin composition at a temperature of about 80 to 200 degrees centigrade over a period of about 10 minutes to 10 hours.

FIG. 1 is a view illustrating a cross-section structure of an example of a semiconductor device using a resin composition for encapsulating a semiconductor according to the present invention. A semiconductor element 1 is fixed on a die pad 3 through a cured die bond material 2. An electrode pad of the semiconductor element 1 and a lead frame 5 are connected by means of a wire 4. The semiconductor element 1 is encapsulated with a cured product 6 of the resin composition for sealing a semiconductor.

Figure 2:
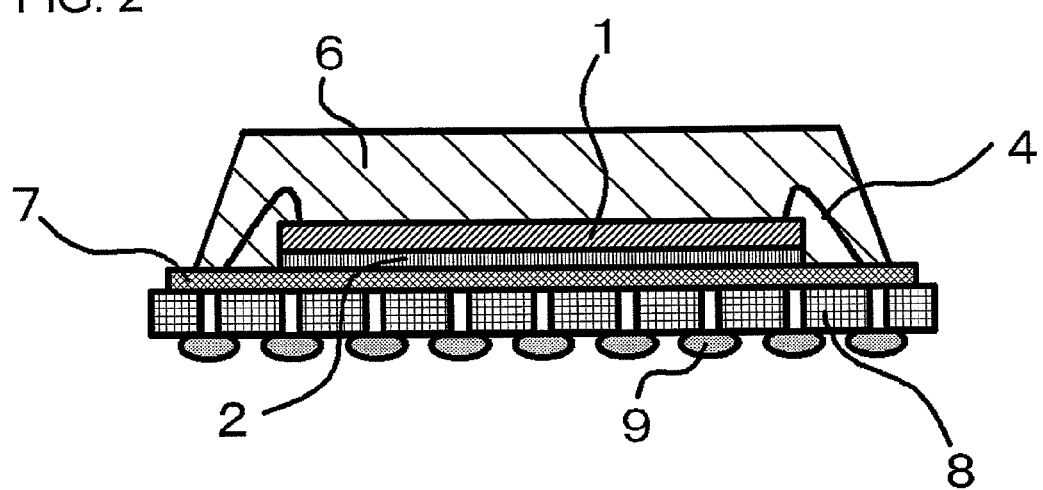
FIG. 2 is a view illustrating a cross-section structure of an example of a one-side encapsulated semiconductor device using a resin composition for encapsulating a semiconductor according to the present invention.

FIG. 2 is a view illustrating a cross-section structure of an example of a one-side encapsulated semiconductor device using a resin composition for encapsulating a semiconductor according to the present invention. A semiconductor element 1 is fixed on a substrate 8 through a solder resist 7 and a cured die bond material 2. An electrode pad of the semiconductor element 1 and an electrode pad on the substrate 8 are connected through the solder resist 7 by means of a wire 4. Only one side on which the semiconductor element 1 of the substrate 8 is mounted is encapsulated with a cured product 6 of the resin composition for encapsulating. The electrode pad on the substrate 8 is internally connected to a solder ball 9 provided on the non-encapsulated surface of the substrate 8.

According to the present invention, a resin composition for encapsulating a semiconductor excellent in the flowability and moldability during molding of a package can be obtained without damaging the tablet moldability. Thus, it can be suitably used for a semiconductor device obtained by encapsulating a semiconductor element with a tablet-like resin composition for encapsulating a semiconductor, in particular, a semiconductor device in which a thickness of the resin encapsulation portion is thin and the wire density is high, a semiconductor device with high pin count and reduction in pitches of wires, or a semiconductor device of a structure obtained by laminating a plurality of semiconductor chips.

EXAMPLES

The present invention is now illustrated in detail below with reference to Examples. However, the present invention is not restricted to these Examples. The mixing amount below is expressed in part by mass. The components used in Examples and Comparative Examples are as follows.

The gel permeation chromatography (GPC) of the curing agents 1 to 5 was measured under the following conditions. 6 ml of tetrahydrofuran (THF) as the solvent was added to 20 mg of a sample of the phenol novolac resin 1, and the mixture was fully dissolved and used for the GPC measurement. As the GPC system, there was used Module W2695x1 commercially available from Waters, TSK Guard Column HHR-Lx1 (a guard column, diameter: 6.0 mm, pipe length: 40 mm) commercially available from Tosoh Corporation, TSK-GEL GMHHR-Lx2 (a polystyrene gel column, diameter: 7.8 mm, pipe length: 30 mm) commercially available from Tosoh Corporation and a differential refractive index (RI) detector W2414 commercially available from Waters which were serially connected. The flow rate of the pump was 0.5 ml/min, the internal temperature of the column and differential refractometer was set to 40 degrees centigrade, and a measurement solution was injected from a 100-μl injector for the measurement. For analysis of the sample, a calibration curve produced by the use of a monodispersed polystyrene (hereinafter referred to as PS) standard sample was used. The calibration curve was obtained by plotting the logarithmic value of the PS molecular weight and the PS peak detection time (retention time), and making a straight line using a cubic regression equation. As the standard PS sample for producing a calibration curve, there were used Model S-1.0 (peak molecular weight: 1,060), S-1.3 (peak molecular weight: 1,310), S-2.0 (peak molecular weight: 1,990), S-3.0 (peak molecular weight: 2,970), S-4.5 (peak molecular weight: 4,490), S-5.0 (peak molecular weight: 5,030), S-6.9 (peak molecular weight: 6,930), S-11 (peak molecular weight: 10,700) and S-20 (peak molecular weight: 19,900), all of which were Shodex standard SL-105 series commercially available from Showa Denko K.K.

Epoxy Resin

Epoxy resin 1: A tetramethyl bisphenol F type epoxy resin (YSLV-80XY, commercially available from Tohto Kasei Co., Ltd, epoxy equivalent: 190, melting point: 80 degrees centigrade)

Epoxy resin 2: A bisphenol A type epoxy resin (YL6810, commercially available from Japan Epoxy Resin Co., Ltd., epoxy equivalent: 172, melting point: 45 degrees centigrade)

Epoxy resin 3: A tetramethyl biphenyl type epoxy resin (YX4000H, commercially available from Japan Epoxy Resin Co., Ltd., epoxy equivalent: 185, melting point: 107 degrees centigrade)

Epoxy resin 4: An epoxy resin represented by the following formula (3) (YSLV-120TE, commercially available from Tohto Kasei Co., Ltd, epoxy equivalent: 240, melting point: 120 degrees centigrade)

Epoxy resin 5: A phenol aralkyl type epoxy resin having a biphenylene skeleton (NC3000, commercially available from Nippon Kayaku Co., Ltd., epoxy equivalent: 276, softening point: 58 degrees centigrade)

Epoxy resin 6: A dicyclopentadiene type epoxy resin (HP7200L, commercially available from DIC Corporation, epoxy equivalent: 244, softening point: 56 Degrees centigrade)

Epoxy resin 7: A methoxynaphthalene type epoxy resin (EXA7320, commercially available from DIC Corporation, epoxy equivalent: 251, softening point: 58 degrees centigrade)

Epoxy resin 8: A dihydroanthraquinone type epoxy resin (product name: YX8800, commercially available from Japan Epoxy Resin Co., Ltd., equivalent: 180, melting point: 110 degrees centigrade)

[Chemical Formula 12]

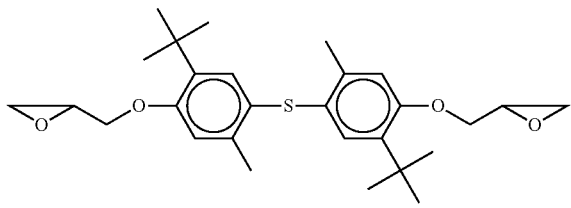

(3)

Curing Agent

Curing agent 1: A phenol novolac resin represented by the following general formula (2) (LV-70S, commercially available from Gunei Chemical Industry Co., Ltd., hydroxyl equivalent: 104, softening point: 67 degrees centigrade, content of c=1 component: 63.8%, content of C≥4 component: 4.4%, content of c=0 component: 7.4%, number average molecular weight: 332)

Curing agent 2: A phenol novolac resin represented by the following general formula (2) (VR-9305, commercially available from Mitsui Chemicals, Inc., hydroxyl equivalent: 104, softening point: 75.5 degrees centigrade, content of c=1 component: 43.1%, content of C≥4 component: 32.1%, content of c=0 component: 7.7%, number average molecular weight: 391)

Curing agent 3: A reactor equipped with a stirrer, a thermometer and a condenser was charged with 1,700 parts by mass of phenol and 350 parts by mass of 37% formalin, and 17 parts by mass of oxalic acid was added thereto. Then, the mixture was reacted for 4 hours while maintaining the reaction temperature at 95 to 105 degrees centigrade, and subsequently heated up to 180 degrees centigrade for carrying out vacuum distillation at a pressure reduction degree of 5,000 Pa to remove unreacted phenol, and then heated up to 230 degrees centigrade for carrying out steam distillation with the water vapor content of 2 g/min at a pressure reduction degree of 5,000 Pa, whereby a phenol novolac resin represented by the following general formula (2) (hydroxyl equivalent: 104, softening point: 64.4 degrees centigrade, content of c=1 component: 33.1%, content of C≥4 component: 11.7%, content of c=0 component: 19.4%, number average molecular weight: 338) was obtained.

Curing agent 4: A phenol novolac resin represented by the following general formula (2) (PR-HF-3, commercially available from Sumitomo Bakelite Co., Ltd., hydroxyl equivalent: 104, softening point: 80 degrees centigrade, content of c=1 component: 14.5%, content of C≥4 component: 46.5%, content of c=0 component: 18.9%, number average molecular weight: 437)

Curing agent 5: A synthesis procedure was carried out in the same manner as in the synthesis of the curing agent 3, except that 80 parts by mass of bisphenol F (a special grade reagent, 4,4'-dihydroxydiphenylmethane, commercially available from Wako Pure Chemical Industries, Ltd.) was added into the system after the reaction, and the steam distillation temperature was changed from 230 degrees centigrade to 215 degrees centigrade, whereby a phenol novolac resin represented by the following general formula (2) (hydroxyl equivalent: 104, softening point: 63.0 degrees centigrade, content of c=1 component: 21.3%, content of C≥4 component: 22.4%, content of c=0 component: 32.1%, number average molecular weight: 333) was obtained.

Figure 3:
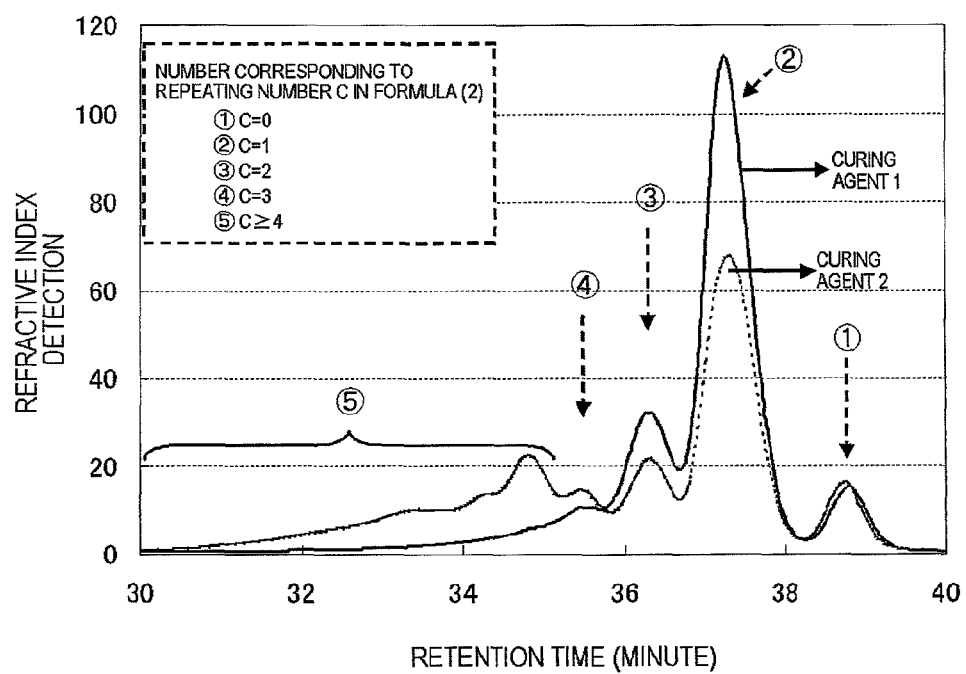
FIG. 3 is a GPC chart of curing agents 1 and 2.
Figure 4:
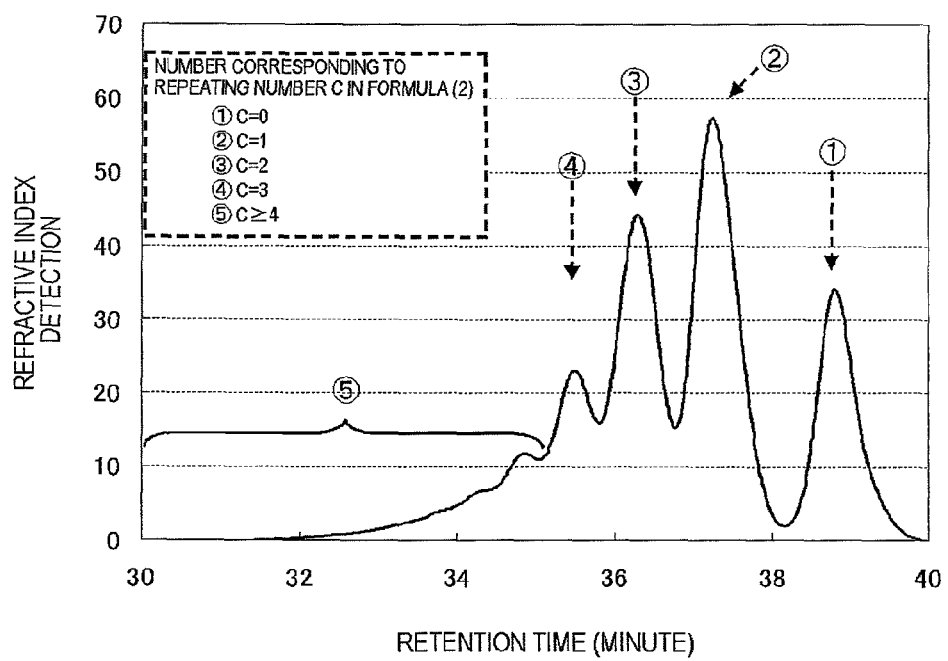
FIG. 4 is a GPC chart of a curing agent 3.
Figure 5:
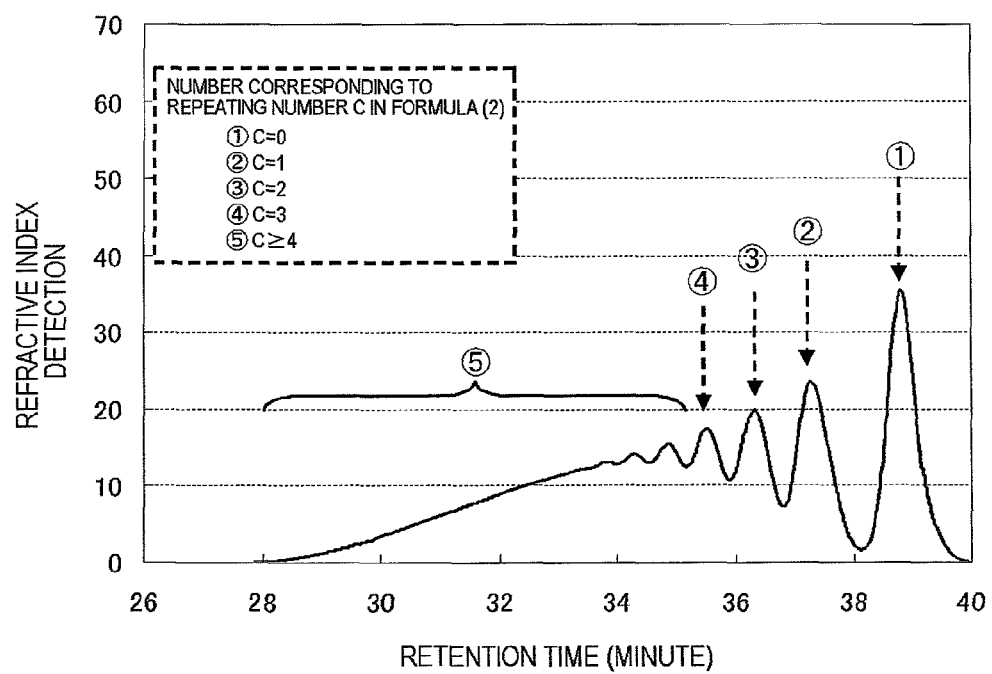
FIG. 5 is a GPC chart of a curing agent 4.
Figure 6:
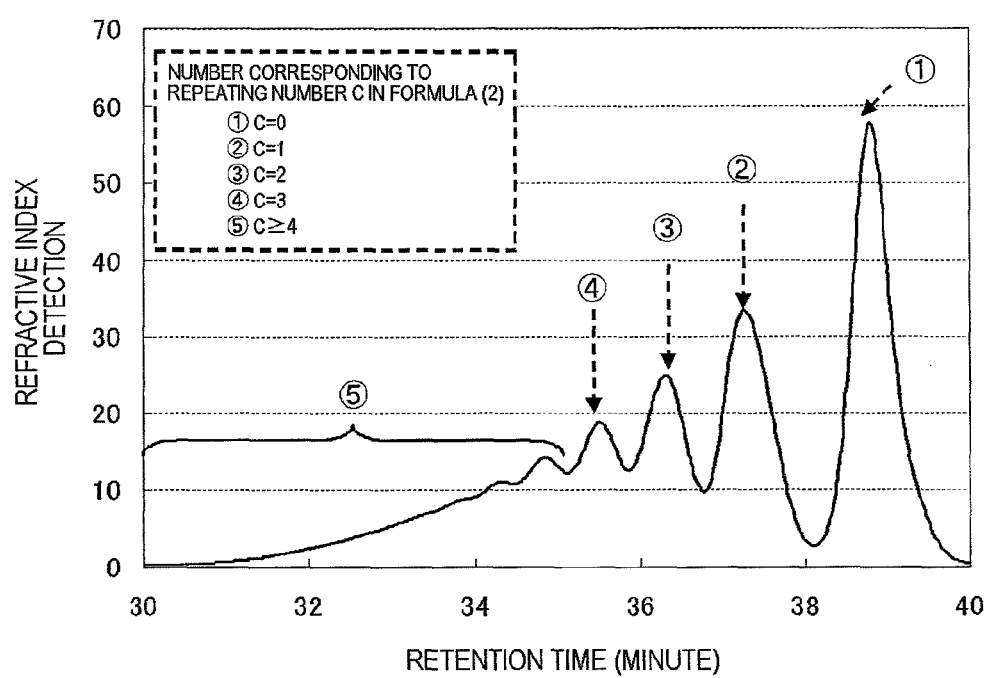
FIG. 6 is a GPC chart of a curing agent 5.

The contents of respective components of the curing agents 1 to 5, as measured by gel permeation chromatography (GPC), the number average molecular weights and the softening points were illustrated in Table 1, while gel permeation chromatography (GPC) charts of the curing agents 1 and 2 were shown in FIG. 3. Gel permeation chromatography (GPC) charts of the curing agents 3 to 5 were respectively shown in FIGS. 4 to 6.

[Chemical Formula 13]

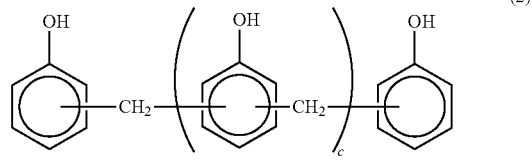

(2)

TABLE 1

|  | Curing agent 1 | Curing agent 2 | Curing agent 3 | Curing agent 4 | Curing agent 5 |
|---|---|---|---|---|---|
| Softening point (° C.) | 67 | 75.5 | 64.4 | 80 | 63 |
| Hydroxyl equivalent (g/eq.) | 104 | 104 | 104 | 104 | 104 |
| Contents of respective components by GPC measurement (area percentage [%]) | | | | | |
| Unidentified low molecular weight component | <0.1 | <0.1 | <0.1 | <0.1 | <0.1 |
| $C = 0$ | 7.4 | 7.7 | 19.4 | 18.9 | 32.1 |
| $C = 1$ | 63.8 | 43.1 | 33.1 | 14.5 | 21.3 |
| $C = 2$ | 17.3 | 11 | 24.2 | 11.1 | 14.1 |
| $C = 3$ | 7.1 | 6 | 11.5 | 8.9 | 10.1 |
| $C \geq 4$ | 4.4 | 32.1 | 11.7 | 46.5 | 22.4 |
| Total | 100 | 99.9 | 99.9 | 99.9 | 100 |
| Number average molecular weight Mn [Da] | 332 | 391 | 338 | 437 | 333 |

Inorganic Filler

Inorganic filler 1: A blend of 100 parts by mass of fused spherical silica, FB560 (commercially available from Denki Kagaku Kogyo Kabushiki Kaisha, average particle diameter: 30 μm), 6.5 parts by mass of synthesized spherical silica, SO-C2 (commercially available from Admatechs Co., Ltd., average particle diameter: 0.5 μm), and 7.5 parts by mass of synthesized spherical silica, SO-C5 (commercially available from Admatechs Co., Ltd., average particle diameter: 30 μm) was used.

Curing accelerator 1: A curing accelerator represented by the following formula (10),

[Chemical Formula 14]

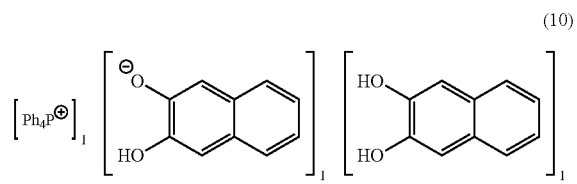

(10)

Silane Coupling Agent

Silane coupling agent 1: γ-glycidoxypropyltrimethoxysilane (KBM-403, commercially available from Shin-Etsu Chemical Co., Ltd.)

Silane coupling agent 2: γ-mercaptopropyltrimethoxysilane (KBM-803, commercially available from Shin-Etsu Chemical Co., Ltd.)

Silane coupling agent 3: N-phenyl-3-aminopropyltrimethoxysilane (KBM-573, commercially available from Shin-Etsu Chemical Co., Ltd.)

Coloring Agent

Coloring agent 1: Carbon black (MA600, commercially available from Mitsubishi Chemical Corporation)

Releasing Agent

Releasing agent 1: A carnauba wax (Nikko Carnauba, commercially available from Nikko Fine Products Co., Ltd., melting point: 83 degrees centigrade)

Example 1

8.19 parts by mass of the epoxy resin 1, 4.31 parts by mass of the curing agent 1, 86.5 parts by mass of the inorganic filler 1, 0.4 parts by mass of the curing accelerator 1, 0.1 part by mass of the silane coupling agent 1, 0.05 parts by mass of the silane coupling agent 2, 0.05 parts by mass of the silane coupling agent 3, 0.3 parts by mass of the coloring agent 1 and 0.1 part by mass of the releasing agent 1 were mixed at a normal temperature using a mixer, melt-kneaded with a hot roll at 85 to 100 degrees centigrade, stretched in a sheet form and cooled, and then pulverized with a hammer mill, whereby a powdery resin composition was obtained. The obtained resin composition was used for the evaluation in the following manner. The evaluation results are shown in Table 2.

Spiral Flow

Using a low-pressure transfer molding machine (KTS-15, commercially available from Kohtaki Precision Machine Co., Ltd.), the powdery resin composition was injected into a mold for measuring a spiral flow in accordance with EMMI-1-66 under the conditions of a mold temperature of 175 degrees centigrade, an injection pressure of 6.9 MPa and a pressure application time of 120 seconds to determine a flow length. The spiral flow is a parameter of flowability, and a larger value of the spiral flow means better flowability. The spiral flow is given in units of centimeters (cm).

Tablet Moldability

The resin composition was continuously tableted into 200 tablets at a tableting pressure of 600 Pa by adjusting to have a finished weight of 15 g and a size of φ18 mm×height of about 31 mm of the tablet using a powder molding press (S-20-A, commercially available from Tamagawa Machinery Co., Ltd.). The number of tablets with poor appearance after tableting or broken tablets was counted and expressed by the failure rate (%). Next, 100 of good tablets were packed in a cardboard box of an interior polyethylene bag and fallen from a height of 30 cm three times, and then appearance was observed and the failure rate (%) after the falling test was counted.

Measurement of Wire Sweeping Amount

The tableted encapsulating material was injected under the conditions of a temperature of 175 degrees centigrade, a pressure of 6.9 MPa, and a time period of 120 seconds using a low-pressure transfer molding machine to mold respective 10 packages of 208-pin QFP packages for the evaluation test of the wire sweeping amount (size; 28×28×2.4 mm, Cu lead frame, test element: 9×9 mm, wire; Au, diameter: 1.2 mils, length: 5 mm). The molded 208-pin QFP packages were observed with a soft X-ray fluoroscope (Model: PMS-160, commercially available from YXLON International Kabushiki Kaisha). As a method of calculating the wire sweeping amount, the sweeping amount of the wire that was swept (transformed) the most in one package was taken as (F), and the length of the wire was taken as (L) to calculate the sweeping amount of F/L×100 (O), and the mean value of 10 packages was shown in Table 2. Incidentally, when the wire sweeping amount was less than 5%, it was acceptable. When it was not less than 5%, it was not acceptable.

Examples 2 to 17, Comparative Examples 1 to 8

According to combinations of Tables 2, 3 and 4, a resin composition was produced in the same manner as in Example 1, and evaluated in the same manner as in Example 1. The evaluation results are shown in Tables 2, 3 and 4. Incidentally, in Examples 2 and 3, two kinds of curing agents were blended in advance according to the ratios in Table 2, melt-blended at 100 degrees centigrade and further pulverized, and then other raw materials were mixed together at a normal temperature using a mixer, and the following procedure was the same as in Example 1, whereby a powdery resin composition was obtained. Furthermore, in Examples 2 and 3 described in Table 2, with respect to the softening point of the phenol resin (B1), and the contents of the c=1 component, c≥4 component and c=0 component, two kinds of curing agents were blended in advance according to the ratios in Table 2, melt-blended at 100 degrees centigrade and further pulverized, whereby the softening point and gel permeation chromatography (GPC) were measured.

TABLE 2

| | | | | Example | | | | |
|---|---|---|---|---|---|---|---|---|
| | | | | 1 | 2 | 3 | 4 | 5 |
| Composition [parts by mass] | Epoxy resin (A) | Epoxy resin (A1) | Epoxy resin 1 | 8.19 | 8.19 | 8.19 | 5.92 | 5.87 |
| | | | Epoxy resin 2 | | | | | |
| | | | Epoxy resin 3 | | | | | |
| | | | Epoxy resin 4 | | | | | |
| | | Other epoxy resins | Epoxy resin 5 | | | | 2.54 | |
| | | | Epoxy resin 6 | | | | | 2.51 |
| | | | Epoxy resin 7 | | | | | |
| | | | Epoxy resin 8 | | | | | |
| | Curing agent (B) | Phenol resin (B1) | Curing agent 1 | 4.31 | 1.94 | 3.02 | 4.04 | 4.12 |
| | | | Curing agent 2 | | 2.37 | | | |
| | | | Curing agent 3 | | | | | |
| | | | Curing agent 4 | | | 1.29 | | |
| | | | Curing agent 5 | | | | | |
| | Inorganic filler (C) | | Inorganic filler 1 | 86.5 | 86.5 | 86.5 | 86.5 | 86.5 |
| | Other additives | | Curing accelerator 1 | 0.4 | 0.4 | 0.4 | 0.4 | 0.4 |
| | | | Silane coupling agent 1 | 0.1 | 0.1 | 0.1 | 0.1 | 0.1 |
| | | | Silane coupling agent 2 | 0.05 | 0.05 | 0.05 | 0.05 | 0.05 |
| | | | Silane coupling agent 3 | 0.05 | 0.05 | 0.05 | 0.05 | 0.05 |
| | | | Coloring agent 1 | 0.3 | 0.3 | 0.3 | 0.3 | 0.3 |
| | | | Releasing agent 1 | 0.1 | 0.1 | 0.1 | 0.1 | 0.1 |
| Contents of respective components in phenol resin (B1)[Note 1] | | | c = 1 component [%] | 63.8 | 52.4 | 49.0 | 63.8 | 63.8 |
| | | | c ≥ 4 component [%] | 4.4 | 19.6 | 17.0 | 4.4 | 4.4 |
| | | | c = 0 component [%] | 7.4 | 7.6 | 10.9 | 7.4 | 7.4 |
| Temperature difference between A1 melting point and B1 softening point[Note 1] | | Melting point $T_{A1}$ of epoxy resin (A1) [° C.] | | 80 | 80 | 80 | 80 | 80 |
| | | Softening point $T_{B1}$ of phenol resin (B1) [° C.] | | 67 | 72 | 71 | 67 | 67 |
| | | Temperature difference $T_{A1} - T_{B1}$ [° C.] | | 13 | 8 | 9 | 13 | 13 |
| Evaluation results | | Spiral flow [cm] | | 143 | 122 | 120 | 113 | 117 |
| | | Wire sweeping amount [%] | | 2.9 | 3.7 | 3.6 | 4.5 | 3.5 |
| | | Tablet failure rate (immediately after tableting) [%] | | 0 | 0 | 0 | 0.5 | 0 |
| | | Tablet failure rate (after falling test) [%] | | 0 | 0 | 0 | 0 | 0 |

| | | | | Example | | | |
|---|---|---|---|---|---|---|---|
| | | | | 6 | 7 | 8 | 9 |
| Composition [parts by mass] | Epoxy resin (A) | Epoxy resin (A1) | Epoxy resin 1 | 5.88 | 4.06 | | |
| | | | Epoxy resin 2 | | | 5.78 | 5.72 |
| | | | Epoxy resin 3 | | | | |
| | | | Epoxy resin 4 | | | | |
| | | Other epoxy resins | Epoxy resin 5 | | | 2.47 | |
| | | | Epoxy resin 6 | | | | 2.45 |
| | | | Epoxy resin 7 | 2.52 | | | |
| | | | Epoxy resin 8 | | 4.06 | | |
| | Curing agent | Phenol resin | Curing agent 1 | 4.10 | 4.38 | 4.25 | 4.33 |

TABLE 2-continued

| (B) | (B1) | Curing agent 2 | | | | |
| | | Curing agent 3 | | | | |
| | | Curing agent 4 | | | | |
| | | Curing agent 5 | | | | |
| Inorganic filler (C) | | Inorganic filler 1 | 86.5 | 86.5 | 86.5 | 86.5 |
| Other additives | | Curing accelerator 1 | 0.4 | 0.4 | 0.4 | 0.4 |
| | | Silane coupling agent 1 | 0.1 | 0.1 | 0.1 | 0.1 |
| | | Silane coupling agent 2 | 0.05 | 0.05 | 0.05 | 0.05 |
| | | Silane coupling agent 3 | 0.05 | 0.05 | 0.05 | 0.05 |
| | | Coloring agent 1 | 0.3 | 0.3 | 0.3 | 0.3 |
| | | Releasing agent 1 | 0.1 | 0.1 | 0.1 | 0.1 |
| Contents of respective components in phenol resin (B1)[Note 1] | | $c = 1$ component [%] | 63.8 | 63.8 | 63.8 | 63.8 |
| | | $c \geq 4$ component [%] | 4.4 | 4.4 | 4.4 | 4.4 |
| | | $c = 0$ component [%] | 7.4 | 7.4 | 7.4 | 7.4 |
| Temperature difference between A1 melting point and B1 softening point[Note 1] | Melting point $T_{A1}$ of epoxy resin (A1) [° C.] | | 80 | 80 | 45 | 45 |
| | Softening point $T_{B1}$ of phenol resin (B1) [° C.] | | 67 | 67 | 67 | 67 |
| | Temperature difference $T_{A1} - T_{B1}$ [° C.] | | 13 | 13 | −22 | −22 |
| Evaluation results | Spiral flow [cm] | | 119 | 122 | 120 | 128 |
| | Wire sweeping amount [%] | | 4.2 | 3.2 | 4.4 | 3.1 |
| | Tablet failure rate (immediately after tableting) [%] | | 0 | 0 | 0 | 0 |
| | Tablet failure rate (after falling test) [%] | | 0 | 0 | 0 | 0 |

[Note 1] Curing agents in Tables 2 and 3: Using two kinds of curing agents which were blended in advance according to the ratios in Table 2, melt-blended at 100 degrees centigrade and further pulverized, a resin composition used in Examples was produced, GPC was measured, and the softening point was measured.

TABLE 3

| | | | | Example | | | |
| | | | | 10 | 11 | 12 | 13 |
| Composition [parts by mass] | Epoxy resin (A) | Epoxy resin (A1) | Epoxy resin 1 | | | | |
| | | | Epoxy resin 2 | 5.73 | 3.99 | | |
| | | | Epoxy resin 3 | | | 8.11 | 5.89 |
| | | | Epoxy resin 4 | | | | |
| | | Other epoxy resins | Epoxy resin 5 | | | | 2.52 |
| | | | Epoxy resin 6 | | | | |
| | | | Epoxy resin 7 | 2.46 | | | |
| | | | Epoxy resin 8 | | 3.99 | | |
| | Curing agent (B) | Phenol resin (B1) | Curing agent 1 | 4.31 | 4.52 | 4.39 | 4.09 |
| | | | Curing agent 2 | | | | |
| | | | Curing agent 3 | | | | |
| | | | Curing agent 4 | | | | |
| | | | Curing agent 5 | | | | |
| | Inorganic filler (C) | | Inorganic filler 1 | 86.5 | 86.5 | 86.5 | 86.5 |
| | Other additives | | Curing accelerator 1 | 0.4 | 0.4 | 0.4 | 0.4 |
| | | | Silane coupling agent 1 | 0.1 | 0.1 | 0.1 | 0.1 |
| | | | Silane coupling agent 2 | 0.05 | 0.05 | 0.05 | 0.05 |
| | | | Silane coupling agent 3 | 0.05 | 0.05 | 0.05 | 0.05 |
| | | | Coloring agent 1 | 0.3 | 0.3 | 0.3 | 0.3 |
| | | | Releasing agent 1 | 0.1 | 0.1 | 0.1 | 0.1 |
| Contents of respective components in phenol resin (B1)[Note 1] | | | $c = 1$ component [%] | 63.8 | 63.8 | 63.8 | 63.8 |
| | | | $c \geq 4$ component [%] | 4.4 | 4.4 | 4.4 | 4.4 |
| | | | $c = 0$ component [%] | 7.4 | 7.4 | 7.4 | 7.4 |
| Temperature difference between A1 melting point and B1 softening point[Note 1] | Melting point $T_{A1}$ of epoxy resin (A1) [° C.] | | | 45 | 45 | 107 | 107 |
| | Softening point $T_{B1}$ of phenol resin (B1) [° C.] | | | 67 | 67 | 67 | 67 |

TABLE 3-continued

| | | | | | | | |
|---|---|---|---|---|---|---|---|
| Evaluation results | | Temperature difference $T_{A1} - T_{B1}$ [° C.] | −22 | −22 | 40 | 40 | |
| | | Spiral flow [cm] | 124 | 142 | 150 | 128 | |
| | | Wire sweeping amount [%] | 4.4 | 3.1 | 3.0 | 4.9 | |
| | | Tablet failure rate (immediately after tableting) [%] | 0 | 0 | 1 | 0 | |
| | | Tablet failure rate (after falling test) [%] | 0 | 0 | 1 | 1 | |

| | | | | Example | | | |
|---|---|---|---|---|---|---|---|
| | | | | 14 | 15 | 16 | 17 |
| Composition [parts by mass] | Epoxy resin (A) | Epoxy resin (A1) | Epoxy resin 1 | | | | |
| | | | Epoxy resin 2 | | | | |
| | | | Epoxy resin 3 | 5.83 | 5.84 | 4.04 | |
| | | | Epoxy resin 4 | | | | 8.82 |
| | | Other epoxy resins | Epoxy resin 5 | | | | |
| | | | Epoxy resin 6 | 2.50 | | | |
| | | | Epoxy resin 7 | | 2.50 | | |
| | | | Epoxy resin 8 | | | 4.04 | |
| | Curing agent (B) | Phenol resin (B1) | Curing agent 1 | 4.17 | 4.15 | 4.42 | 3.68 |
| | | | Curing agent 2 | | | | |
| | | | Curing agent 3 | | | | |
| | | | Curing agent 4 | | | | |
| | | | Curing agent 5 | | | | |
| | Inorganic filler (C) | | Inorganic filler 1 | 86.5 | 86.5 | 86.5 | 86.5 |
| | Other additives | | Curing accelerator 1 | 0.4 | 0.4 | 0.4 | 0.4 |
| | | | Silane coupling agent 1 | 0.1 | 0.1 | 0.1 | 0.1 |
| | | | Silane coupling agent 2 | 0.05 | 0.05 | 0.05 | 0.05 |
| | | | Silane coupling agent 3 | 0.05 | 0.05 | 0.05 | 0.05 |
| | | | Coloring agent 1 | 0.3 | 0.3 | 0.3 | 0.3 |
| | | | Releasing agent 1 | 0.1 | 0.1 | 0.1 | 0.1 |
| Contents of respective components in phenol resin (B1)[Note 1] | | | c = 1 component [%] | 63.8 | 63.8 | 63.8 | 63.8 |
| | | | c ≥ 4 component [%] | 4.4 | 4.4 | 4.4 | 4.4 |
| | | | c = 0 component [%] | 7.4 | 7.4 | 7.4 | 7.4 |
| Temperature difference between A1 melting point and B1 softening point[Note 1] | | Melting point $T_{A1}$ of epoxy resin (A1) [° C.] | | 107 | 107 | 107 | 120 |
| | | Softening point $T_{B1}$ of phenol resin (B1) [° C.] | | 67 | 67 | 67 | 67 |
| | | Temperature difference $T_{A1} - T_{B1}$ [° C.] | | 40 | 40 | 40 | 53 |
| Evaluation results | | Spiral flow [cm] | | 131 | 124 | 145 | 131 |
| | | Wire sweeping amount [%] | | 3.5 | 4.3 | 3.3 | 3.8 |
| | | Tablet failure rate (immediately after tableting) [%] | | 2 | 0 | 0 | 3 |
| | | Tablet failure rate (after falling test) [%] | | 0 | 1 | 2 | 2 |

TABLE 4

| | | | | Comparative Example | | | |
|---|---|---|---|---|---|---|---|
| | | | | 1 | 2 | 3 | 4 |
| Composition [parts by mass] | Epoxy resin (A) | Epoxy resin (A1) | Epoxy resin 1 | 8.22 | 8.22 | 8.22 | 8.22 |
| | | | Epoxy resin 2 | | | | |
| | | | Epoxy resin 3 | | | | |
| | | | Epoxy resin 4 | | | | |
| | | Other epoxy resins | Epoxy resin 5 | | | | |
| | | | Epoxy resin 6 | | | | |
| | | | Epoxy resin 7 | | | | |
| | | | Epoxy resin 8 | | | | |
| | Curing agent (B) | Phenol resin (B1) | Curing agent 1 | | | | |
| | | | Curing agent 2 | 4.28 | | | |
| | | | Curing agent 3 | | 4.28 | | |
| | | | Curing agent 4 | | | 4.28 | |
| | | | Curing agent 5 | | | | 4.28 |

TABLE 4-continued

| | | | | | | |
|---|---|---|---|---|---|---|
| | Inorganic filler (C) | Inorganic filler 1 | 86.5 | 86.5 | 86.5 | 86.5 |
| | Other additives | Curing accelerator 1 | 0.4 | 0.4 | 0.4 | 0.4 |
| | | Silane coupling agent 1 | 0.1 | 0.1 | 0.1 | 0.1 |
| | | Silane coupling agent 2 | 0.05 | 0.05 | 0.05 | 0.05 |
| | | Silane coupling agent 3 | 0.05 | 0.05 | 0.05 | 0.05 |
| | | Coloring agent 1 | 0.3 | 0.3 | 0.3 | 0.3 |
| | | Releasing agent 1 | 0.1 | 0.1 | 0.1 | 0.1 |
| Contents of respective components in phenol resin (B1)[Note 1] | | $c = 1$ component [%] | 43.1 | 33.1 | 14.5 | 21.3 |
| | | $c \geq 4$ component [%] | 32.1 | 11.7 | 46.5 | 22.4 |
| | | $c = 0$ component [%] | 7.7 | 19.4 | 18.9 | 32.1 |
| Temperature difference between A1 melting point and B1 softening point[Note 1] | Melting point $T_{A1}$ of epoxy resin (A1) [°C] | | 80 | 80 | 80 | 80 |
| | Softening point $T_{B1}$ of phenol resin (B1) [°C] | | 75 | 65 | 80 | 63 |
| | Temperature difference $T_{A1} - T_{B1}$ [°C] | | 5 | 15 | 0 | 17 |
| Evaluation results | Spiral flow [cm] | | 102 | 124 | 87 | 145 |
| | Wire sweeping amount [%] | | 5.9 | 4.9 | 6.1 | 3.0 |
| | Tablet failure rate (immediately after tableting) [%] | | 0 | 17.5 | 0 | 19.5 |
| | Tablet failure rate (after falling test) [%] | | 4 | 11 | 0 | 39 |

| | | | | Comparative Example | | | |
|---|---|---|---|---|---|---|---|
| | | | | 5 | 6 | 7 | 8 |
| Composition [parts by mass] | Epoxy resin (A) | Epoxy resin (A1) | Epoxy resin 1 | | | | |
| | | | Epoxy resin 2 | | | | |
| | | | Epoxy resin 3 | | | | |
| | | | Epoxy resin 4 | | | | |
| | | Other epoxy resins | Epoxy resin 5 | 9.18 | | | |
| | | | Epoxy resin 6 | | 8.87 | | |
| | | | Epoxy resin 7 | | | 8.94 | |
| | | | Epoxy resin 8 | | | | 8.04 |
| | Curing agent (B) | Phenol resin (B1) | Curing agent 1 | 3.32 | 3.63 | 3.56 | 4.46 |
| | | | Curing agent 2 | | | | |
| | | | Curing agent 3 | | | | |
| | | | Curing agent 4 | | | | |
| | | | Curing agent 5 | | | | |
| | Inorganic filler (C) | | Inorganic filler 1 | 86.5 | 86.5 | 86.5 | 86.5 |
| | Other additives | | Curing accelerator 1 | 0.4 | 0.4 | 0.4 | 0.4 |
| | | | Silane coupling agent 1 | 0.1 | 0.1 | 0.1 | 0.1 |
| | | | Silane coupling agent 2 | 0.05 | 0.05 | 0.05 | 0.05 |
| | | | Silane coupling agent 3 | 0.05 | 0.05 | 0.05 | 0.05 |
| | | | Coloring agent 1 | 0.3 | 0.3 | 0.3 | 0.3 |
| | | | Releasing agent 1 | 0.1 | 0.1 | 0.1 | 0.1 |
| Contents of respective components in phenol resin (B1)[Note 1] | | | $c = 1$ component [%] | 63.8 | 63.8 | 63.8 | 63.8 |
| | | | $c \geq 4$ component [%] | 4.4 | 4.4 | 4.4 | 4.4 |
| | | | $c = 0$ component [%] | 7.4 | 7.4 | 7.4 | 7.4 |
| Temperature difference between A1 melting point and B1 softening point[Note 1] | Melting point $T_{A1}$ of epoxy resin (A1) [°C] | | | — | — | — | — |
| | Softening point $T_{B1}$ of phenol resin (B1) [°C] | | | 67 | 67 | 67 | 67 |
| | Temperature difference $T_{A1} - T_{B1}$ [°C] | | | — | — | — | — |
| Evaluation results | Spiral flow [cm] | | | 98 | 90 | 111 | 142 |
| | Wire sweeping amount [%] | | | 5.7 | 6.2 | 5.8 | 3.3 |
| | Tablet failure rate (immediately after tableting) [%] | | | 0 | 8.5 | 0 | 23 |
| | Tablet failure rate (after falling test) [%] | | | 0 | 13.5 | 0 | 42 |

According to Examples 1 to 17, there were obtained a resin composition containing an epoxy resin (A1) having a structure represented by the general formula (1) and a phenol resin (B1) represented by the general formula (2), wherein the content of a c=1 component contained in the total amount of the phenol resin (B1) represented by the general formula (2) was not less than 40% in terms of area percentage, and the content of a C≥4 component was not more than 20% in terms of area percentage, as measured by the area method of gel permeation chromatography; a resin composition in which the kind and the mixing ratio of the epoxy resin (A1) were changed; and a resin composition in which the contents of the c=1 component and C≥4 component in the phenol resin (B1) represented by the general formula (2) were changed. However, as a result, all these resin compositions were excellent in a balance among the flowability (spiral flow), wire sweep and tablet moldability.

On the other hand, in Comparative Examples 1 and 3, there was obtained a resin composition containing a phenol resin (B1) represented by the general formula (2), wherein, however, the content of a C≥4 component contained in the total amount of the phenol resin (B1) represented by the general formula (2) exceeded 20% in terms of area percentage, as measured by the area method of gel permeation chromatography. As a result, the flowability (spiral flow) was reduced, and the wire sweep was deteriorated. Meanwhile, in Comparative Examples 2 and 4, there was obtained a resin composition containing a phenol resin (B1) represented by the general formula (2), wherein, however, the content of a c=1 component contained in the total amount of the phenol resin (B1) represented by the general formula (2) was below 40% in terms of area percentage, as measured by the area method of gel permeation chromatography. As a result, the tablet moldability was deteriorated. Furthermore, in Comparative Example 3, the content of a c=1 component was also below 40%, whereas in Comparative Example 3, the content of a C≥4 component was far more than 20%. As a result, the tablet moldability was relatively excellent. In Comparative Examples 5 to 7, an epoxy resin (A1) having a structure represented by the general formula (1) was not used. As a result, the flowability (spiral flow) was lowered and the wire sweep was deteriorated. Furthermore, in Comparative Example 6 using the epoxy resin 6 (a dicyclopentadiene type epoxy resin), the tablet moldability was deteriorated. Furthermore, in Comparative Example 8, an epoxy resin (A1) having a structure represented by the general formula (1) was not used, but an epoxy resin 8 (a dihydroanthraquinone type epoxy resin) of a crystalline epoxy resin was used. As a result, the flowability (spiral flow) and the wire sweep were excellent, but the tablet moldability was deteriorated.

As shown in the above results, only when a resin composition contains an epoxy resin (A1) having a structure represented by the general formula (1) and a phenol resin (B1) represented by the general formula (2), wherein the content of a c=1 component contained in the total amount of the phenol resin (B1) represented by the general formula (2) is not less than 40% in terms of area percentage, and the content of a C≥4 component is not more than 20% in terms of area percentage, as measured by the area method of gel permeation chromatography, the flowability (spiral flow), wire sweep and tablet moldability were well balanced. It was considered that the above results were obtained because of the synergic effect in combination of use of an epoxy resin (A1) having a structure represented by the general formula (1), and use of a phenol resin (B1) represented by the general formula (2), the content of a c=1 component contained in the total amount of the phenol resin (B1) represented by the general formula (2) of not less than 40% in terms of area percentage, and the content of a C≥4 component of not more than 20% in terms of area percentage, as measured by the area method of gel permeation chromatography.

The present application claims priorities to Japanese patent application No. 2009-057387 filed on Mar. 11, 2009. The content of the application is incorporated herein by reference in their entirety.

The invention claimed is:

1. A resin composition for encapsulating a semiconductor containing an epoxy resin (A), a curing agent (B) and an inorganic filler (C), wherein:
    said epoxy resin (A) comprises an epoxy resin (A1) having a structure represented by the following general formula (1),
    said curing agent (B) comprises a phenol resin (B1) represented by the following general formula (2),
    the content of a c=1 component contained in the total amount of the phenol resin (B1) represented by the general formula (2) is not less than 40% in terms of area percentage,
    the content of a C≥4 component is not more than 20% in terms of area percentage, as measured by the area method of gel permeation chromatography, and
    said epoxy resin (A1) has a melting point, and when melting point is $T_{A1}$, and the softening point of said phenol resin (B1) is $T_{B1}$, the absolute value $|T_{A1}-T_{B1}|$ of a temperature difference between $T_{A1}$ and $T_{B1}$ is not more than 35 degrees centigrade;

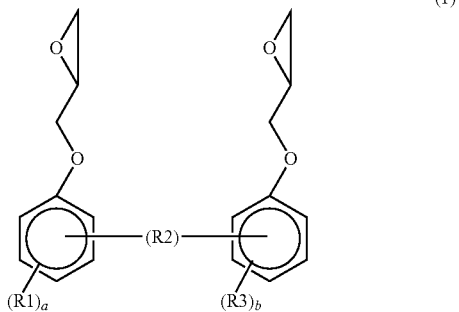

(1)

wherein, in the above general formula (1), each of R1 and R3 is a hydrocarbon group having 1 to 5 carbon atoms, which are the same or different from each other; R2 represents any of a direct bond, a hydrocarbon group having 1 to 5 carbon atoms, —S— and —O—; and each of a and b is an integer of 0 to 4, which are the same or different from each other,

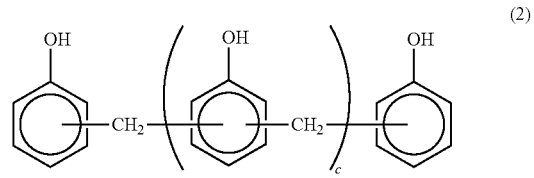

(2)

wherein, in the above general formula (2), c is an integer of 0 to 20.

2. The resin composition for encapsulating a semiconductor according to claim 1, wherein, in said phenol resin (B1), the content of a c=0 component contained in the total amount of the phenol resin (B1) represented by said general formula (2) is not more than 16% in terms of area percentage, as measured by the area method of gel permeation chromatography.

3. The resin composition for encapsulating a semiconductor according to claim 1, wherein said epoxy resin (A1) is a crystalline epoxy resin obtained by subjecting a phenol compound selected from the group consisting of alkyl group-substituted or unsubstituted biphenol, bisphenol A, bisphenol F, bisphenol S, bisphenol A/D and oxybisphenol to diglycidyl etherification.

4. The resin composition for encapsulating a semiconductor according to claim 1, wherein said resin composition for encapsulating a semiconductor in a tablet form is used for encapsulating a semiconductor element by the transfer molding method.

5. A semiconductor device obtained by encapsulating a semiconductor element with a cured product of the resin composition for encapsulating a semiconductor according to claim 1.

6. The resin composition for encapsulating a semiconductor according to claim 1, wherein in general formula (1):
- each of R1 and R3 is a hydrocarbon group having 1 to 5 carbon atoms, which are the same or different from each other;
- R2 represents any hydrocarbon group having 1 to 5 carbon atoms, and —O—; and
- each of a and b is an integer of 0 to 4, which are the same or different from each other.

* * * * *